United States Patent
West et al.

(10) Patent No.: US 9,893,243 B2
(45) Date of Patent: Feb. 13, 2018

(54) LED-BASED LIGHT SOURCE UTILIZING ASYMMETRIC CONDUCTORS

(71) Applicant: Bridgelux, Inc., Livermore, CA (US)

(72) Inventors: R. Scott West, Pleasanton, CA (US); Yan Chai, Fremont, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

(21) Appl. No.: 15/279,646

(22) Filed: Sep. 29, 2016

(65) Prior Publication Data
US 2017/0018687 A1    Jan. 19, 2017

Related U.S. Application Data

(63) Continuation of application No. 13/086,310, filed on Apr. 13, 2011, now Pat. No. 9,478,719, which is a
(Continued)

(51) Int. Cl.
*H01L 33/48*    (2010.01)
*H01L 33/58*    (2010.01)
(Continued)

(52) U.S. Cl.
CPC ............ *H01L 33/486* (2013.01); *H01L 33/46* (2013.01); *H01L 33/502* (2013.01); *H01L 33/58* (2013.01); *H01L 33/60* (2013.01); *H01L 33/62* (2013.01); *H01L 33/54* (2013.01); *H01L 2224/16225* (2013.01); *H01L 2224/32225* (2013.01);
(Continued)

(58) Field of Classification Search
CPC ......... H01L 2924/0002; H01L 2924/00; H01L 33/54; H01L 51/5268; H01L 2224/11
See application file for complete search history.

(56) References Cited

U.S. PATENT DOCUMENTS

| 6,576,488 | B2 | 6/2003 | Collins et al. | 438/29 |
| 6,965,361 | B1 | 11/2005 | Sheats et al. | 345/82 |
| 7,042,022 | B2 | 5/2006 | Han et al. | 257/99 |
| 7,344,902 | B2 | 3/2008 | Basin et al. | 438/27 |
| 7,352,011 | B2 | 4/2008 | Smits et al. | 257/99 |
| 7,452,737 | B2 | 11/2008 | Basin et al. | 438/27 |
| 7,748,873 | B2 | 7/2010 | Kim et al. | 362/328 |

(Continued)

OTHER PUBLICATIONS

Int'l Search Report issued by Korean Intel. Property Office (KIPO) in related int'l application PCT/US2011/051607 dated Apr. 10, 2012 (7 pages).

*Primary Examiner* — Tony Tran
(74) *Attorney, Agent, or Firm* — Imperium Patent Works; Darien K. Wallace

(57) ABSTRACT

A light source includes LED dies that are flip-chip mounted on a flexible plastic substrate. The LED dies are attached to the substrate using an asymmetric conductor material with deformable conducting particles sandwiched between surface mount contacts on the LED dies and traces on the substrate. A diffusively reflective material containing light scattering particles is used instead of expensive reflective cups to reflect light upwards that is emitted sideways from the LED dies. The diffusively reflective material is dispensed over the top surface of the substrate and contacts the side surfaces of the dies. The light scattering particles are spheres of titanium dioxide suspended in silicone. The light source is manufactured in a reel-to-reel process in which the asymmetric conductor material and the diffusively reflective material are cured simultaneously. A silicone layer of molded lenses including phosphor particles is also added over the mounted LED dies in the reel-to-reel process.

20 Claims, 15 Drawing Sheets

Related U.S. Application Data continuation-in-part of application No. 12/941,799, filed on Nov. 8, 2010, now Pat. No. 8,455,895.

(51) Int. Cl.
| | |
|---|---|
| *H01L 33/60* | (2010.01) |
| *H01L 33/62* | (2010.01) |
| *H01L 33/46* | (2010.01) |
| *H01L 33/50* | (2010.01) |
| *H01L 33/54* | (2010.01) |

(52) U.S. Cl.
CPC ............ *H01L 2224/45144* (2013.01); *H01L 2224/49107* (2013.01); *H01L 2224/73204* (2013.01); *H01L 2224/73265* (2013.01); *H01L 2924/00014* (2013.01); *H01L 2924/181* (2013.01); *H01L 2924/3011* (2013.01); *H01L 2933/005* (2013.01); *H01L 2933/0025* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 7,815,338 B2 | 10/2010 | Siemiet et al. | 362/218 |
| 7,858,408 B2 | 12/2010 | Mueller et al. | 438/27 |
| RE42,112 E | 2/2011 | Han et al. | 257/99 |
| 7,901,113 B2 | 3/2011 | Kim et al. | 362/328 |
| 7,926,975 B2 | 4/2011 | Siemiet et al. | 362/240 |
| 7,938,562 B2 | 5/2011 | Ivey et al. | 362/276 |
| 7,946,729 B2 | 5/2011 | Ivey et al. | 362/254 |
| 2008/0048200 A1 | 2/2008 | Mueller et al. | 257/98 |
| 2008/0157114 A1 | 7/2008 | Basin et al. | 257/98 |
| 2010/0072495 A1 | 3/2010 | Yamazaki | 257/89 |
| 2010/0265693 A1 | 10/2010 | Ryu et al. | 362/84 |
| 2011/0057205 A1 | 3/2011 | Mueller et al. | 257/84 |
| 2011/0069490 A1 | 3/2011 | Liu | 362/259 |
| 2011/0073250 A1* | 3/2011 | Muirhead | B29C 66/433 156/256 |
| 2012/0193666 A1* | 8/2012 | Namiki | C09J 163/00 257/98 |

\* cited by examiner

LED-BASED LIGHT SOURCE UTILIZING ASYMMETRIC CONDUCTORS

CROSS REFERENCE TO RELATED APPLICATION

This application is a continuation of, and claims priority under 35 U.S.C. § 120 from, nonprovisional U.S. patent application Ser. No. 13/086,310 entitled "LED-Based Light Source Utilizing Asymmetric Conductors," filed on Apr. 13, 2011, now U.S. Pat. No. 9,478,719, which in turn is a continuation-in-part of, and claims priority under 35 U.S.C. § 120 from, nonprovisional U.S. patent application Ser. No. 12/941,799, entitled "LED-Based Light Source Utilizing Asymmetric Conductors," by Yan Chai and Calvin B. Ward, filed on Nov. 8, 2010, now U.S. Pat. No. 8,455,895. The subject matter of each of the aforementioned patent documents is incorporated herein by reference.

TECHNICAL FIELD

The present invention relates generally to packaging for light-emitting diodes, and more particularly, to a low-cost method of making an LED light source with improved light extraction characteristics.

BACKGROUND INFORMATION

Light emitting diodes (LEDs) are an important class of solid-state devices that convert electric energy into light. Improvements in these devices have resulted in their use in lighting fixtures as replacements for conventional incandescent and fluorescent light sources. LEDs have significantly longer lifetimes than both incandescent bulbs and fluorescent tubes. In addition, the energy conversion efficiency of LEDs has now reached the same level as that obtained in fluorescent light fixtures and promises to exceed even these efficiencies.

A single LED produces too little light to be used as a replacement for a conventional lighting source in most applications. Hence, a replacement light source must utilize a large number of individual LEDs. The packaging costs and reliability problems that result from having to use large numbers of individual LEDs present challenges that must be overcome if LED-based light sources are to reach their full potential as replacements for conventional light sources.

FIG. 1 (prior art) is a cross-sectional view of a portion of a prior art, phosphor-converted, LED light source. Light source 20 includes a plurality of LEDs of which LED 21 is typical. The LEDs are mounted on a printed circuit board 32 that includes a heat-spreading layer 33, an insulating layer 34, and a conducting layer that is patterned to provide electrical conductors such as conductor 35. The LEDs are mounted in depressions having reflecting walls 36 that re-direct light leaving the side surfaces of the LEDs such that the light leaves the light source in the vertical direction as shown by the arrows. The surface of heat-spreading layer 33 is typically covered with a reflecting material that redirects any light that is emitted in a downward direction into the upward direction. The LEDs are covered by a layer of phosphor 37 that converts a portion of the blue light generated by the LEDs to light in the yellow region of the optical spectrum. The combination of the blue and yellow light is perceived as "white" light by a human observer.

The LEDs include a light-emitting structure 22 that is deposited on a sapphire substrate 23. The light-emitting structure can be viewed as an active layer 24 that is sandwiched between an n-type GaN layer 28 that is deposited on substrate 23 and a p-type GaN layer 25 that is deposited over the active layer. The device is powered from contacts 26 and 27. Since p-type GaN has a very high resistivity, a current spreading layer 29 is typically deposited on the surface of layer 25. In the arrangement shown in FIG. 1, light is extracted through the top surface of the LED, and hence, the current spreading layer must be transparent. Typically, indium tin oxide (ITO) is used for the current spreading layer.

The electrical connections to the LEDs are provided by wire bonds, such as bond 31, that connect the contacts on the LEDs to corresponding contacts on a printed circuit board. The wire bonds present problems in terms of fabrication cost and reliability, particularly when the light source includes a large number of individual dies. The wire bonds are subject to failure both at the time of initial implementation of the bonds and later due to stresses between the phosphor layer and the encapsulated wire bonds. In addition, the wire bonds block a significant fraction of the light leaving the LEDs, as both the bond pads and the gold wire absorb light.

The arrangement shown in FIG. 1 provides good light capture with respect to the light leaving the sides of the LEDs. However, this aspect requires a more complex mounting substrate having reflective cups. The cost of the substrate increases the cost of the light source.

The arrangement shown in FIG. 1 has the advantage of providing good heat conduction because the entire bottom surface of the LEDs is in contact with the heat-spreading layer 33 of the printed circuit board. Heat removal is an important aspect of high-powered LED light sources, as the efficiency of the LEDs decreases with temperature. In addition, mechanical problems that arise from differences in the thermal coefficient of expansion between phosphor layer 37 and printed circuit board 32 become worse as the operating temperature increases.

The problems associated with wire bonds can be reduced by utilizing a flip-chip mounting scheme. FIG. 2 (prior art) is a cross-sectional view of a portion of another prior art light source that utilizes a flip-chip mounting scheme. Light source 40 includes a plurality of surface mounted LEDs. For the purposes of this discussion, a surface mounted LED is defined to be an LED in which both the p-contact and the n-contact are on one side of the LED, light being emitted primarily through an opposing surface of the LED, although some of the light may be emitted through the side surfaces of the LED. In the case shown in FIG. 2, the sapphire substrate 41 faces upward and the LEDs are connected to the mounting substrate by the contacts that are used to power the LEDs. Light is emitted through the sapphire substrate. The p-contact includes a mirror 42 that re-directs light striking the contact such that the light exits through the sapphire substrate or side surfaces of the LED. The mirror can also act as the current spreading layer thereby reducing or eliminating the need to use an ITO layer. While the ITO layer is not needed for current spreading in this arrangement, the ITO layer can still provide an ohmic contact with the p-GaN layer, and hence, a thin ITO layer may be included in the p-contact. Since light does not exit through the p-GaN layer, the p-contact can extend substantially over the entire active layer, and hence the problems of providing current spreading over the highly resistive p-GaN layer are substantially reduced. For the purposes of this discussion, the p-contact will be defined to extend over substantially all of the active layer if the p-contact overlies at least 60 percent of the active layer.

The n-contact and p-contact are bonded to corresponding traces 43 and 44, respectively, on the mounting substrate. These traces are patterned on an insulating layer 45 that overlies the heat-dissipating core region 46 of the printed circuit board. Suitable bonding materials that utilize solder, thermal compression bonding, or asymmetric conducting adhesives are known to the art. Novel asymmetric adhesives will be discussed in more detail below.

While the arrangement shown in FIG. 2 reduces the problems associated with the wire bonds, heat dissipation and the loss of light that exits through the sidewalls of the LEDs remains problematic. If the LEDs are mounted in reflective cups as described above, the cost of the substrate becomes a problem. Furthermore, the bonding process requires that the LEDs be pressed against the printed circuit board during the bonding process, and hence providing a pressure mechanism that can operate on all of the LEDs in a light source at once is problematic if the LEDs are in reflective cups.

An LED packaging arrangement is sought that allows light leaving the sides of flip-chip mounted LEDs to be emitted upwards without using reflective cups.

SUMMARY

The present invention includes a light source and method for making the same. The light source includes a plurality of surface mount LEDs that are bonded to a mounting substrate by a layer of asymmetric conductor. Each LED has surface mount contacts on a first surface thereof and emits light from a second surface thereof that is opposite the first surface. The surface mount contacts include a p-contact and an n-contact for powering that LED. Each LED is characterized by an active layer that generates light of a predetermined wavelength, the p-contact having an area that is greater than or equal to at least half of the active region in the LED. The mounting substrate includes a top surface having a plurality of connection traces. Each connection trace includes an n-trace positioned to underlie a corresponding one of the n-contacts and a p-trace positioned to underlie a corresponding one of the p-contacts, the p-trace having an area greater than the p-contact. The layer of asymmetric conductor is sandwiched between the surface mount contacts and the connection traces.

In one aspect of the invention, the LEDs are spaced apart from one another and the LEDs emit light from side surfaces of the LEDs. The asymmetric conductor is present in spaces between the LEDs to a height such that light leaving the side surfaces of the LEDs enters the asymmetric conductor located between the LEDs. The asymmetric conductor includes scattering particles that scatter the light leaving the side surfaces.

In another aspect of the invention, a light source includes LED dies that are flip-chip mounted onto a flexible plastic substrate. The flexible substrate is used in a reel-to-reel process to make a strip light source. The dies are attached to the substrate using an asymmetric conductor material (ACF material) in which deformable conducting particles are sandwiched between surface mount contacts on the LED dies and connection traces on the flexible substrate. A diffusively reflective material reflects light that is emitted sideways from the LED dies upwards towards a phosphor layer. The diffusively reflective material is disposed on the top surface of the substrate and contacts the side surfaces of the LED dies. In one embodiment, the diffusively reflective material includes spheres of titanium dioxide suspended in silicone. The light source is manufactured in a reel-to-reel process in which the asymmetric conductor material and the diffusively reflective material are cured at the same time. A silicone layer of molded lenses that has either suspended phosphor particles or a layer of phosphor is also added in the reel-to-reel process over the mounted LED dies.

The light scattering particles in the reflective material adjacent to the LED dies provide a means for reflecting light that is emitted from the side surface of the LED dies away from the substrate without placing each LED die in an expensive reflective cup.

A method of manufacturing a light source uses a reel-to-reel process to deposit an amount of asymmetric conductor material on a mounting substrate, such as a flexible plastic substrate. The asymmetric conductor material includes deformable conducting particles suspended in a transparent carrier material, such as epoxy or silicone. An LED die is mounted onto the substrate in a flip-chip manner over the deposited amount of asymmetric conductor material. Then a diffusively reflective material is dispensed onto the substrate adjacent to the mounted LED die such that the diffusively reflective material contacts the LED die. The diffusively reflective material includes light scattering particles suspended in the transparent carrier material. The LED die is then pressed against the substrate such that some of the deformable conducting particles deform and form an electrical connection between contacts on the LED die and traces on the substrate. The transparent carrier material is then heated such that both the asymmetric conductor material and the diffusively reflective material cure to a hardened state. A layer of cured transparent carrier material with suspended phosphor particles is then deposited over the LED die and the diffusively reflective material. The layer of cured transparent carrier material includes molded lenses.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

A novel LED packaging arrangement allows light leaving the sides of flip-chip mounted LEDs to be emitted upwards without using reflective cups by making the surface of the mounting substrate between the LEDs reflective and by filling the regions betweens the LEDs with a transparent material that includes scattering particles. The light leaving the sides of the LEDs is scattered until it either leaves the light source in a generally upward direction or is absorbed after multiple reflections. While re-direction of light by scattering is less efficient than embodiments that utilize cups or other reflectors, the reduced cost of fabrication often is more important, as additional LEDs can be added to the array to make up for light losses. While this mode of light re-direction does not require reflective cups, the process does require a separate deposition step in which scattering material is introduced between the LEDs. If the LEDs are in a closely packed array, this injection of material between the LEDs presents challenges.

Heat dissipation requires a low thermal resistance path from the LED to the underlying core region and a low thermal resistance path from core region to the structure that finally transfers the heat to the environment, typically at an air interface. If either of these paths presents a large thermal resistance, the LEDs will be forced to operate at elevated temperatures to drive the heat along the resistive path. Typically, GaN LEDs are designed to operate at temperatures below 100° C. or 75° C. above ambient. In one aspect of the invention, the thermal paths from the LEDs to the final heat-radiating structure that transfers the heat to the environment are dimensioned such that the heat generated in the LEDs can be transferred to the environment without requiring the LEDs to be operated at a temperature that is greater than 75° C. above the temperature of the environment in question.

Figure 1:
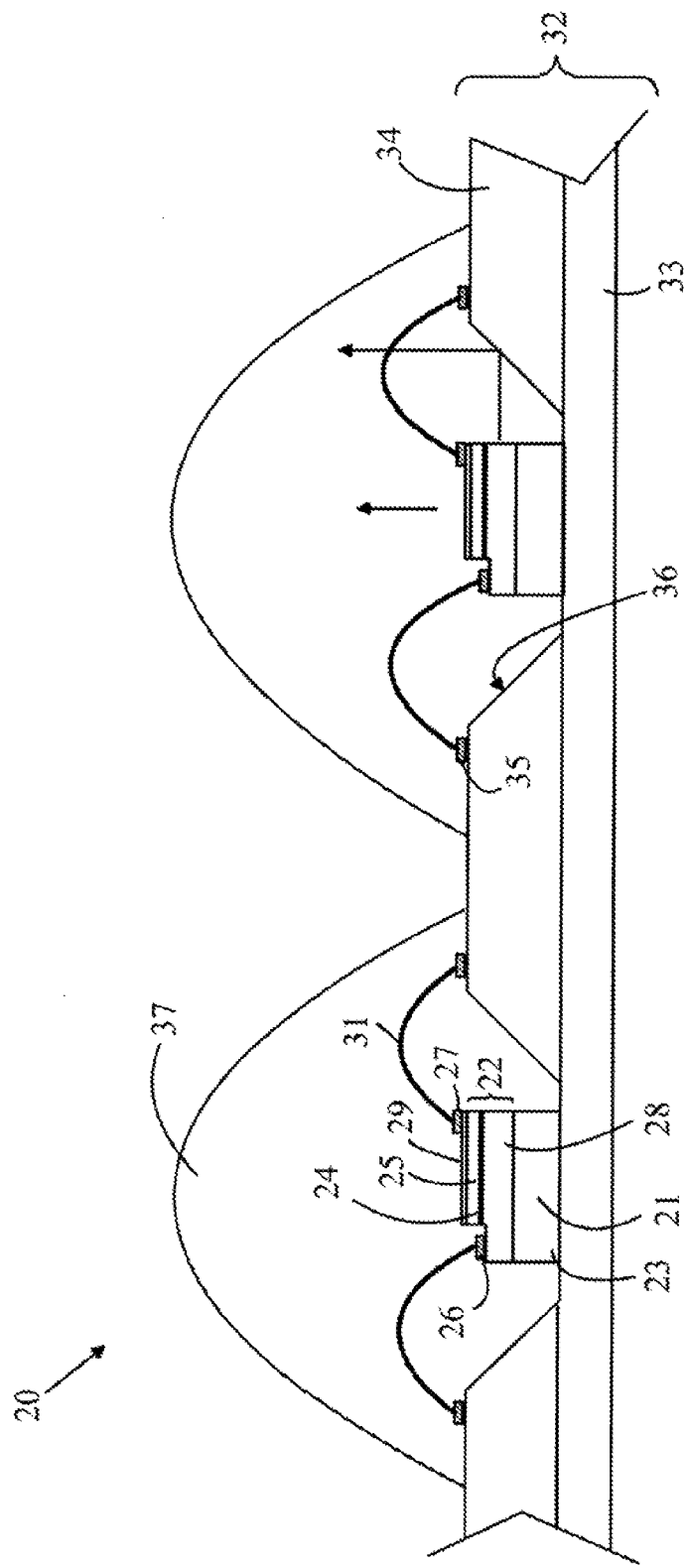
FIG. 1 (prior art) is a cross-sectional view of a portion of a prior art, phosphor-converted, LED light source.
Figure 2:
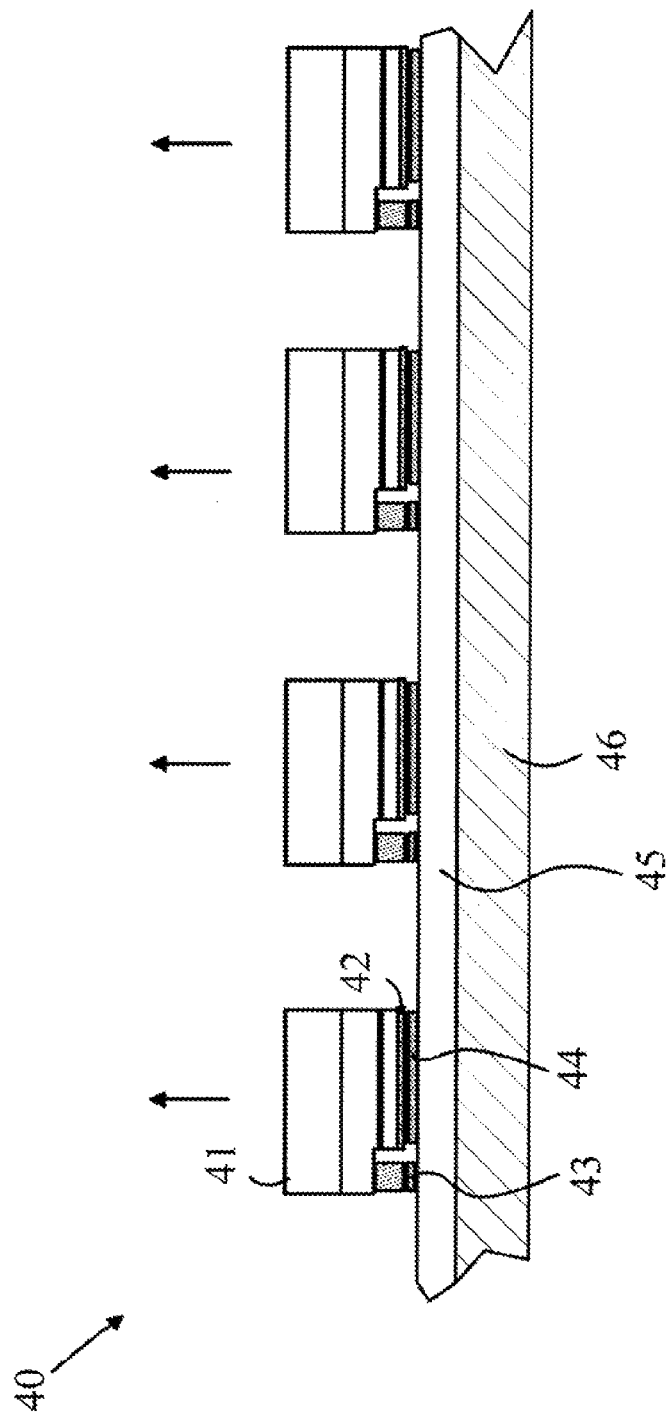
FIG. 2 (prior art) is a cross-sectional view of a portion of another prior art light source.

The path from the LEDs to the underlying core region has two potential bottlenecks. The first is the connection between the p-contact and the underlying electrical trace, i.e., trace 44 in FIG. 2. The second is the thermal path from trace 44 to the underlying core region 46. Except in the case of an asymmetric conducting adhesive, the first bottleneck is not potentially limiting because solder or direct bonding leads to metal-metal bonds having a thermal conductivity that is greater than that of the LED materials. The second bottleneck presents more significant problems because traces must be insulated from the underlying heat-dissipating core, and the insulating layers used in printed circuit boards also have high thermal resistance.

Figure 3:
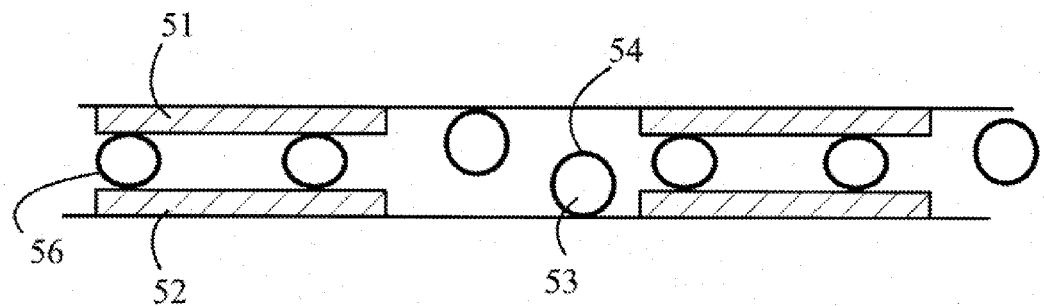
FIG. 3 is a cross-sectional view of a pair of surfaces that are bonded by an asymmetric conductor.

In one aspect of the present invention, an asymmetric conductor that has been modified to provide light scattering as well as vertical connections is utilized. The manner in which asymmetric conductors operate can be more easily understood with reference to FIG. 3, which is a cross-sectional view of a pair of surfaces that are bonded by an asymmetric conductor, such as an anisotropic conductive film (ACF). The asymmetric conductor includes a plurality of elastic metal coated spheres 53 that are suspended in a curable epoxy or other insulating carrier material that can be converted to a solid by a curing process. Each of the spheres is coated with a metallic layer 54 that renders the sphere a conductor. When a layer of this material is pressed between two surfaces as shown in FIG. 3, the spheres that are trapped between conductors 51 and 52 are deformed as shown at 56. The deformed spheres make electrical connections between electrodes 51 and 52. After the carrier medium is cured, the two surfaces are left bonded to one another with opposing conductors on the surfaces being electrically connected to one another. The density of the sphere is chosen to be high enough to assure that any pair of opposing conductors has one or more spheres trapped therebetween but low enough to assure that the spheres do not contact one another in the horizontal direction and form a laterally running conduction path.

Asymmetric conductors have been used for bonding arrays of LEDs to underlying substrates having switching circuitry therein for over a decade. For example, U.S. Pat. No. 6,965,361 teaches a display in which a layer that includes an array of organic LEDs is bonded to a substrate having thin film transistors thereon for switching individual LEDs on and off.

Figure 4:
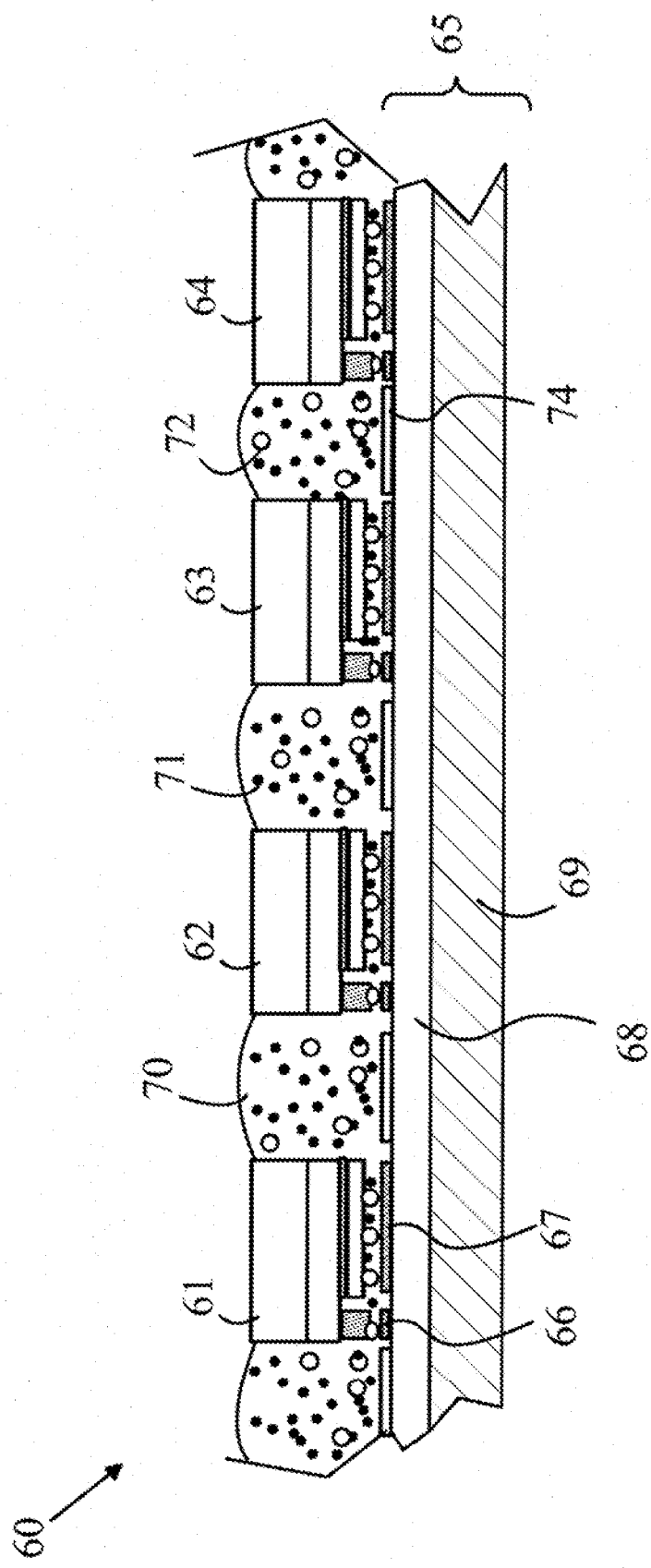
FIG. 4 is a cross-sectional view of a portion of a light source according to one embodiment of the present invention.

FIG. 4 shows a cross-sectional view of a portion of a light source according to one embodiment of the present invention. Light source 60 includes a plurality of surface mounted LEDs 61-64. The LEDs are bonded to traces on a mounting substrate 65. Exemplary traces are labeled at 66 and 67. The traces are patterned from a metal layer that is deposited on an insulating substrate 68 that is bonded to a heat-dissipating spreading layer 69. Substrate 68 will be discussed in more detail below.

The LEDs are bonded to the traces by an asymmetric adhesive layer of asymmetric conductor material that includes two types of particles suspended in an insulating carrier material. The first type of particle is shown at 72 and consists of a compressible polymer sphere with an outer metal coating that operates in a manner analogous to that described above with reference to spheres 53. The second class of particles consists of light reflecting particles 71 that scatter light striking the particles. In one aspect of the present invention, these particles are insulating particles such as $TiO_2$. The scattering particles have diameters that are significantly less than those of the conducting spheres to assure that the scattering particles do not interfere with the compression of the spheres between the surfaces that are to be connected electrically. For example, the scattering particles can have diameters that are less than the minimum distances between the electrodes of the LEDs and the corresponding traces on layer 68. It should be noted that the scattering particles preferably have diameters that are greater than the wavelength of light generated by the LEDs. In one aspect of the invention, the light scattering particles have a maximum dimension that is less than half the diameter of the compressible spheres when the compressible spheres are not deformed by being sandwiched between the conductors.

In one aspect of the invention, the LEDs are pressed into a layer of asymmetric adhesive material while the carrier material is in a liquid state. The layer of asymmetric adhesive material has a thickness that is sufficient to ensure that when all of the LEDs are pressed into the layer, the excess material will be forced into the spaces between the LEDs to a height that ensures that the edges of the LEDs are covered by an asymmetric conductor as shown at 70 such that light leaving the side walls of the LEDs enters the layer of asymmetric conductor material between the LEDs and is scattered by the scattering particles. For example, the thickness of the pre-cured asymmetric conductor medium can be set such that the height of the asymmetric conductor medium between the LEDs is sufficient to ensure that at least 50, 60, 70, 80, or 90 percent of the light leaving the side surfaces of the LEDs enters the asymmetric conductor medium between the LEDs.

In one aspect of the invention, the top surface of layer 68 includes reflective regions, such as region 74, that reflect any light that is scattered downward back into an upward direction. These reflective regions could be separate reflective areas that are not connected to other structures or reflective extensions of the p-contacts.

The conducting spheres can also act as scattering particles provided the metallic coating is chosen from a material that provides a good mirror. In this regard, it should be noted that highly conductive metals such as gold and silver will provide a good mirror surface only if the surface is free of roughness. If the surface is not sufficiently smooth, particles will absorb light via the surface plasmon effect. Prior art particles utilize gold or silver for the outer coating to maximize the conductivity of the coating, and hence do not provide optimal reflective surfaces. In one aspect of the present invention, the conducting particles utilize aluminum as the outer coating to improve the reflectivity of the particles that are trapped between the LEDs.

Heat dissipation is an important issue in high-powered light sources based on LEDs for a number of reasons. First, the efficiency of conversion of electricity to light decreases at high temperatures. Second, the lifetimes of the LEDs also decrease with temperature. Third, the differences in thermal coefficient of expansion between the LEDs and the carrier material used in the asymmetric conductor can lead to fractures in the asymmetric conductor and separation of the LEDs from the underlying structure. Hence, maximizing heat transfer from the LEDs to the surrounding environment is an important aspect of any high-power LED light source design.

The heat generated by the LEDs must be transferred either to the air above the LEDs or to heat-spreading layer 69, which is in thermal contact with a heat-dissipating structure that couples the heat to the environment. To transfer the heat to layer 69, the thermal resistance of layer 68 is preferably much less than the thermal resistance of the asymmetric conductor layer between the contacts on the LED and the corresponding traces on layer 68. The thermal resistance of layer 68 can be reduced by using a material that has a low thermal resistance while still providing electrical insulation and by increasing the surface area of layer 68 over which heat is transferred to layer 69, and decreasing the thickness of layer 68.

Because the thickness of the layer of asymmetric conductor between the p-contact on the LED and corresponding trace on layer 68 is very thin, the thermal resistance is determined by the area of contact between the trace and layer 68. As noted above, it is advantageous to provide a reflecting surface 74 between the LEDs. In one aspect of the present invention, this surface is created by extending the traces opposite the p-contacts on the LEDs, which will be referred to as the p-contact traces. These traces can be coated with an aluminum or other highly reflective coating. The area of the traces can be extended to substantially fill the regions between the LEDs thereby increasing the heat transfer area substantially. The maximum expansion of this area depends on the spacing of the LEDs. In one aspect of the invention, the LEDs are spaced such that the area of the p-traces is at least twice the area of the p-contact on the LEDs.

Figure 5:
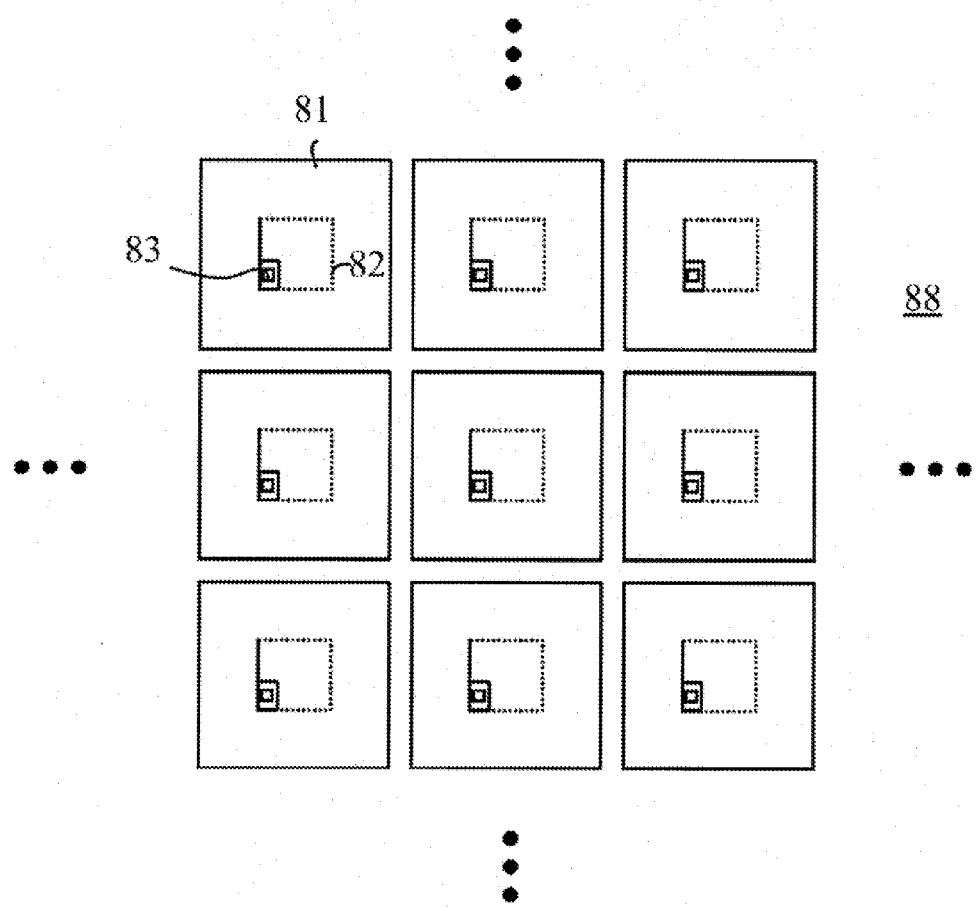
FIG. 5 is a top view of a portion of a mounting substrate before the LEDs have been bonded to the n-traces and p-traces.

FIG. 5 is a top view of a portion of a mounting substrate before the LEDs have been bonded to the n-traces and p-traces. The expanded p-traces are shown at 81. The area in which the LEDs bond is shown in phantom at 82. The n-traces are shown at 83. The electrical connections to the traces on the surface of insulator 88 are made through vias that are under the traces to conducting planes that are in layers under the heat-spreading layer.

Figure 6:
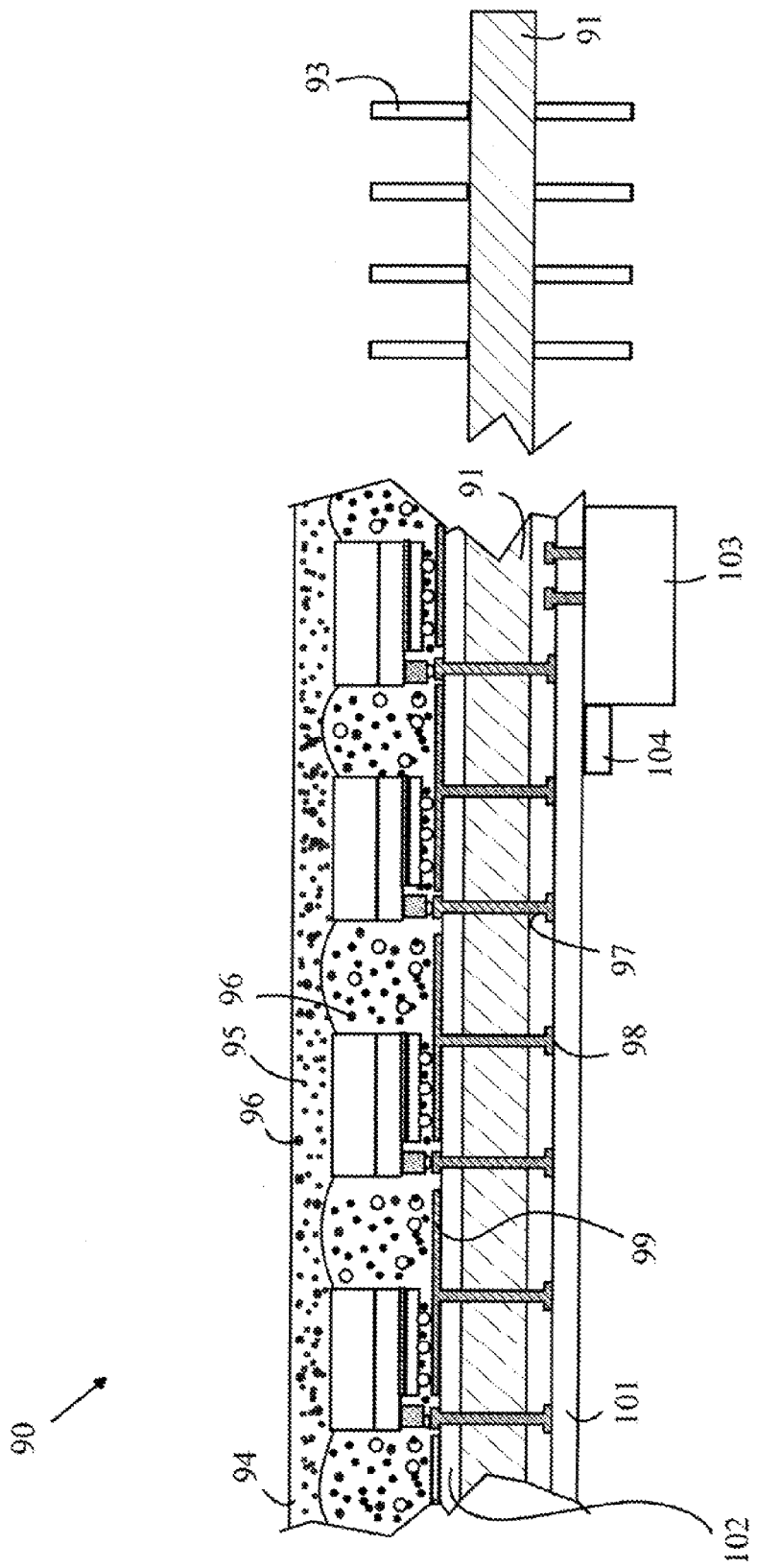
FIG. 6 is a cross-sectional view of a portion of another embodiment of a light source according to the present invention.

FIG. 6 is a cross-sectional view of a portion of another embodiment of a light source according to the present invention. Light source 90 is similar to light source 60 discussed above with reference to FIG. 4 in that light source 90 includes a plurality of LEDs that are bonded to traces on a mounting substrate by asymmetric conductor material. The traces that connect the p-contacts are enlarged as discussed above with respect to FIG. 5. A typical enlarged trace is shown at 99. The traces are connected to a wiring layer 98 by conducting vias 97 that connect each trace to a corresponding conductor on wiring layer 101. These vias pass through insulators in heat-spreading layer 91. Hence, the only high thermal impedance area is the area between the expanded traces on the surface of insulator 102 and heat-spreading layer 91.

Light source 90 also includes a phosphor conversion layer 94 that converts a portion of the light generated by the LEDs to light having a different spectrum that is chosen such that the light leaving layer 94 is perceived to be white light with a predetermined color temperature. The phosphor conversion layer is constructed by suspending phosphor particles 96 in a transparent carrier medium such as an epoxy and then curing the epoxy layer once the suspension has been spread over the light source. Since the areas between the LEDs are filled with the asymmetric conductor material, the phosphor conversion layer can be of a more uniform thickness, and hence, color variations resulting from the blue light from the LEDs passing through different areas of phosphor with differences in thickness of phosphor are reduced.

In one aspect of the present invention, phosphor conversion layer 94 is constructed from the same epoxy medium as the asymmetric conductor. In another aspect of the invention, the phosphor conversion layer has a coefficient of thermal expansion that is substantially equal to that of the asymmetric conductor. Here, the two layers will be defined as having substantially equal thermal coefficients of expansion if the difference in thermal coefficients of expansion is less than a difference that would cause the two layers to separate during the thermal cycling of the light source over its design lifetime. This arrangement reduces the problems associated with having different coefficients of thermal expansion associated with different layers.

To further improve the thermal conductivity of the asymmetric conductor material and phosphor conversion layer, particles 95 of a high thermal conductivity medium can be included in the layers. For example, particles of diamond, crystalline silicon, or GaN can be included in layer 94 and the asymmetric conductor material. These materials have significantly higher thermal conductivity than the epoxy resins used to construct the asymmetric conductor material and phosphor conversion layer, and hence, their inclusion results in a layer having an average thermal conductivity that is higher than that of the epoxy. These materials are also transparent, and hence do not absorb light. The use of such materials is discussed in detail in co-pending U.S. patent application Ser. No. 12/845,104, filed on Jul. 28, 2010, which is incorporated herein by reference.

As noted above, heat-spreading layer 102 moves the heat generated by the LEDs to a region of the light source that has contact with the environment and can include structures such as the fins shown at 93 that help to dissipate the heat to the surroundings. Typically, the heat is dissipated to the air; however, embodiments in which the heat-spreading layer is in contact with other structures that dissipate the heat can also be constructed.

In the above-discussed embodiments, the thermal resistance of layer 102 presents the most challenges in terms of removing heat from the LEDs. This layer can be constructed from a thin polymeric layer or a thin layer of an insulating material such as glass. Alternatively, layer 102 can be constructed from an undoped crystalline material that is grown on heat-spreading layer 91. For example, layers of diamonds can be deposited on a number of substrates at low temperature using chemical vapor deposition or similar techniques. Such coatings are commonly used as scratch resistant coatings on glass or plastics. Similarly, undoped silicon could also be used as the insulator. These crystalline materials have significantly higher thermal conduction than do polymeric layers.

In one aspect of the invention, the wiring layer is coupled to a drive circuit 103 that includes a power connector 104 for providing power to the LEDs. The drive circuit can also include switching circuitry that determines the internal connection topography for the array of LEDs.

Figure 7:
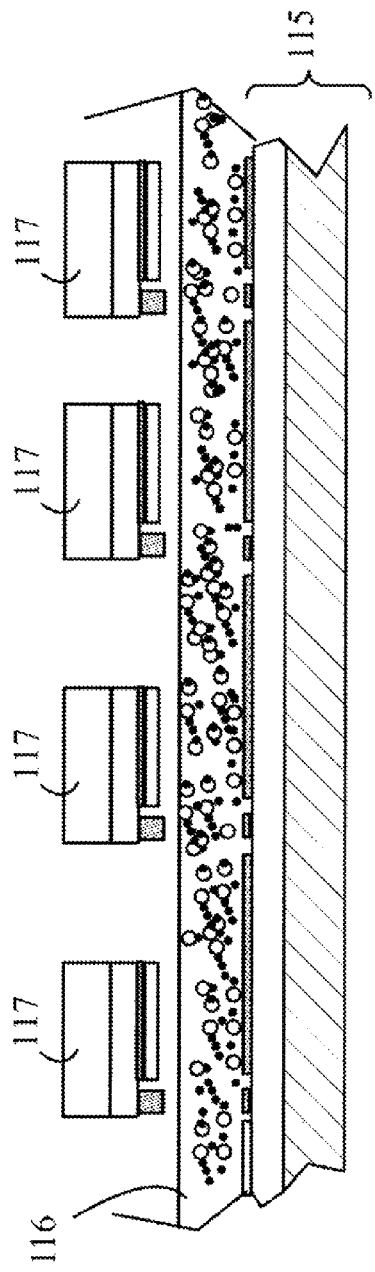
FIGS. 7-9 are cross-sectional views of a portion of a light source according to one embodiment of the present invention at various stages in the fabrication process.
Figure 8:
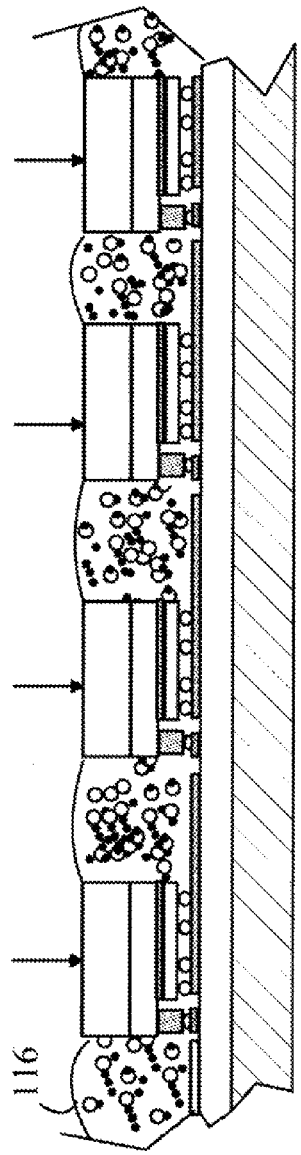
Figure 9:
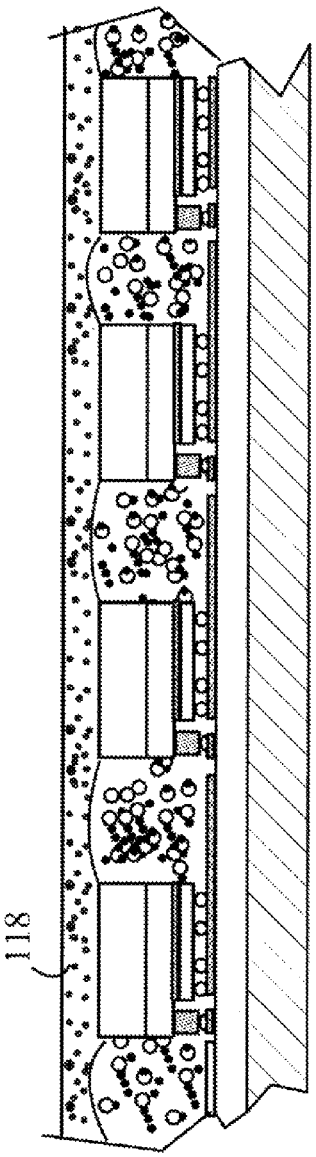

The manner in which a light source according to one embodiment of the present invention is constructed will now be explained with reference to FIGS. 7-9, which are cross-sectional views of a portion of a light source according to one embodiment of the present invention at various stages in the fabrication process. Initially, a mounting substrate 115 is covered with a layer 116 of the asymmetric conductor material in a non-cured liquid state as shown in FIG. 7. Each LED 117 is positioned such that the contacts on the LED are over the corresponding traces on mounting substrate 115. The positioned LEDs are then forced against mounting substrate 115 as shown in FIG. 8. The LEDs can be forced into the layer 116 of asymmetric conductor material one at a time or attached to a temporary carrier and forced into the asymmetric conductor simultaneously. After the LEDs have been forced into the layer of the asymmetric conductor material, pressure is applied to the LEDs and the asymmetric conductor material is heated to cure the material, and hence render the asymmetric conductor layer solid. As noted above, the depth of the uncured asymmetric conductor material is set such that the asymmetric conductor fills the regions betweens the LEDs when the LEDs are forced into the asymmetric conductor material. After the asymmetric conductor material has cured, the layer 118 of phosphor-containing material is deposited over the cured asymmetric conductor layer and cured as shown in FIG. 8.

The above description refers to various surfaces in terms of top or bottom surfaces. These are merely labels that express the relationship of the surfaces as seen in the drawings when the drawings are held in a particular orientation. These labels do not imply any relationship with respect to orientation on the earth.

The LEDs in the above-described embodiments of the present invention have been described in terms of an active layer that is sandwiched between an n-layer and a p-layer, the various layers being grown on a substrate. However, it is to be understood that each of the layers may include a plurality of sub-layers. Similarly, the substrate may include one or more buffer layers that are deposited prior to depositing the LED layers.

Figure 10:
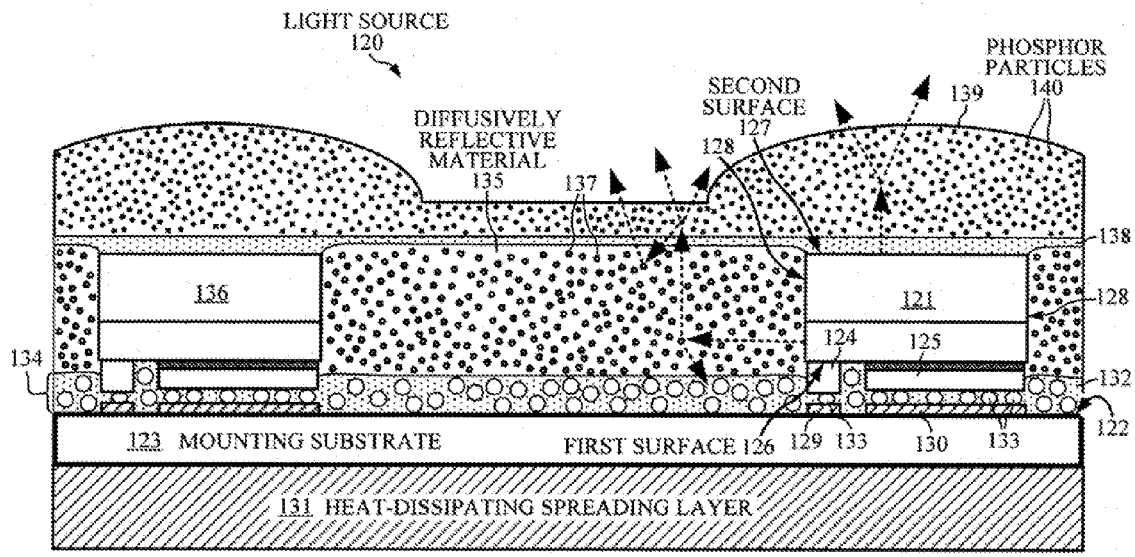
FIG. 10 is a cross-sectional view of another embodiment of a light source that has a diffusively reflective material deposited above a layer of asymmetric conductor material.

FIG. 10 shows a cross-sectional view of a portion of a light source 120 according to another embodiment that exhibits improved light extraction characteristics. Light source 120 includes a surface mounted LED die 121 that is mounted on the top surface 122 of a mounting substrate 123. LED die 121 has surface mount contact pads 124-125 on a first surface 126 and emits light from a second surface 127 and from side surfaces 128. The light that is emitted from second surface 127 first travels from the active layer through the transparent sapphire substrate. N-contact pad 124 and p-contact pad 125 are electrically coupled to an n-trace 129 and a p-trace 130, respectively, that are patterned from a metal layer that is deposited on mounting substrate 123. Mounting substrate 123 is bonded to a heat-dissipating spreading layer 131. An anisotropic conductive film (ACF) material 132, also called asymmetric conductor material, is sandwiched between the surface mount contacts 124-125 and the connection traces 129-130 such that those deformable conducting particles 133 that touch both the contacts 124-125 and traces 129-130 are deformed and form an electrical connection between the contacts and traces. Except between the contacts and traces, however, the deformable conducting particles 133 are suspended in a transparent carrier material and do not conduct current. Unlike the asymmetric conductor material of FIG. 4, asymmetric conductor material 132 includes no smaller light reflecting particles but only the larger deformable conducting particles 133, which are compressible polymer spheres with a metal outer coating. In one example, asymmetric conductor material 132 is SLP-01 made by Sony Chemicals Corp. The conducting particles 133 have an epoxy center electroplated with nickel/gold and have a diameter of about 5 microns. Other conducting particles 133 have a coating of aluminum.

The conducting particles 133 have a relatively low reflectivity of about 60% compared to a reflectivity of about 95% for small spheres of titanium dioxide. In the embodiment of FIG. 4, the light that is emitted from the side surfaces of the LED dies collides not only with the smaller light reflecting particles 71 but also with the larger deformable conducting particles 72. Consequently, about 40% of the light that collides with the larger conducting particles 72 is absorbed and is not reflected up and out of the light source 60. More light can be extracted from light source 120 by removing the larger conducting particles 72 from the transparent carrier material that is placed adjacent to the side surfaces 128. In one example, the transparent carrier material in asymmetric conductor material 132 is an epoxy.

In the embodiment of FIG. 10, only a thin layer 134 of asymmetric conductor material 132 is deposited over top surface 122 of mounting substrate 123. Layer 134 is sufficiently thick to electrically and mechanically connect LED die 121 to mounting substrate 123 but not so thick that asymmetric conductor material 132 covers the side surfaces 128 of LED die 121. After LED die 121 has been mounted onto mounting substrate 123 by pressing the surface mount contacts 124-125 into the connection traces 129-130 such that some conducting particles 133 touch both the contacts 124-125 and the traces 129-130 and are deformed and form an electrical connection between the contacts and traces, asymmetric conductor material 132 is cured by heating. Then a diffusively reflective material 135 is dispensed over layer 134 adjacent to side surface 128 and between LED die 121 and the next LED die 136. The diffusively reflective material 135 includes light scattering particles 137 suspended in a transparent carrier material. In one example, the transparent carrier material in reflective material 135 is silicone, and the light scattering particles 137 are spheres of titanium dioxide ($TiO_2$) with a diameter of about two microns. For comparison, the deformable conducting particles 133 have a diameter of about five microns when they are not deformed. In this example, the light scattering particles 137 have a reflectivity of more than 95%.

After the diffusively reflective material 135 is dispersed over the cured asymmetric conductor material 132, the reflective material 135 is also cured by heating. Then a thin layer 138 of silicone is spread over the top of the LED dies 121, 136 and the diffusively reflective material 135. Before silicone layer 138 is cured, and optics layer 139 of cured silicone is placed over silicone layer 138. Silicone layer 138 acts as an adhesive and attaches optics layer 139 over the top of the LED dies 121, 136 and the diffusively reflective material 135. Silicone layer 138 is then cured by heating. Optics layer 139 has preformed lenses molded from silicone that contains phosphor particles 140. Alternatively, a layer of phosphor particles 140 can be deposited onto the bottom surface of optics layer 139 before optics layer 139 is attached over silicone layer 138. In this case, optics layer 139 would have no phosphor particles dispersed throughout the silicone.

The light extraction characteristics of light source 120 are improved because light leaving the side surfaces 128 of LED die 121 enters diffusively reflective material 135 and is scattered by the scattering particles 137 without first being absorbed by any conducting particles 133 in material 135. A higher percentage of the blue light emitted sideways from LED die 121 is eventually reflected upwards and out of light source 120 or collides with phosphor particles 140 in optics layer 139 and is converted to light in the yellow region of the optical spectrum. In addition, the portion of yellow light that is emitted by the phosphor particles 140 in a downwardly direction is not absorbed by any conducting particles 133 in material 135. The yellow light that is emitted downwardly is more likely to be reflected by the light scattering particles 137 back up through optics layer 139 than if diffusively reflective material 135 contained conducting particles 133.

Some of the light leaving the side surfaces 128 is reflected downwards by the scattering particles 137 and enters layer 134 of asymmetric conductor material 132. Only about 60% of the light that collides with the deformable conducting particles 133 is reflected. In an alternate embodiment, the scattering particles 137 are added to asymmetric conductor material 132 to improve the reflectivity of layer 134. In addition, a reflective coating or trace is deposited on top surface 122 of mounting substrate 123 between LED dies 121 and 136. The reflective coating beneath layer 134 and the scattering particles 137 added to layer 134 increase the amount of light that is reflected back upwards towards optics layer 139. In yet another alternate embodiment, the diffusively reflective material 135 is replaced with phosphor particles dispersed in a transparent carrier material, such as silicone or epoxy. Instead of reflecting the blue light emitted from the LED dies, the phosphor particles absorb the blue light and isotropically emit yellowish light. The yellowish light that is emitted downwards is reflected back up by a reflective coating on top surface 122 of mounting substrate 123 between the LED dies.

Figure 11:
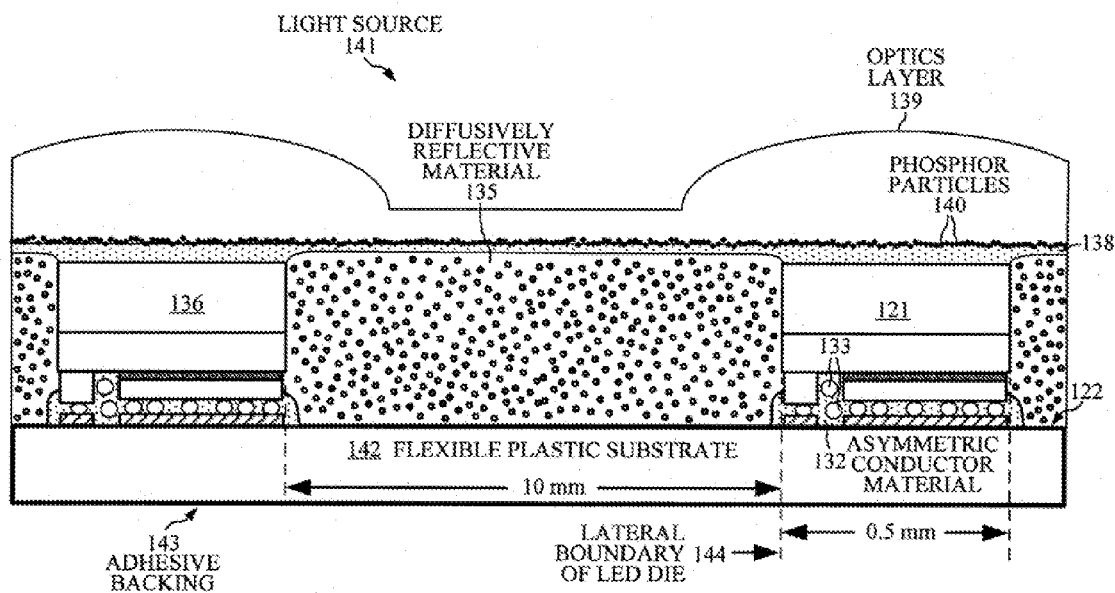
FIG. 11 is a cross-sectional view of yet another embodiment of a light source that has a diffusively reflective material deposited on a flexible plastic substrate.

FIG. 11 shows another embodiment of a light source 141 that can be inexpensively produced and is suitable for use in strip lighting. For example, light source 141 can be manufactured as a strip of LED dies in the linear format of a T8 fluorescent lamp that is installed in a troffer. A 1-by-x strip of LED dies are placed on a flexible plastic substrate 142 having the electrical topology for mounting the LED dies. Flexible plastic substrate 142 is made from a polymer, such as polyimide, polyethylene terephthalate (PET), polyethylene naphthalate (PEN) or liquid crystal polymer (LCP). Flexible plastic substrate 142 has a peel-off adhesive backing 143 that can be used to attach a strip of light source 141 to the inside of a troffer. The metal frame of the troffer then acts as a heat sink. In one example, square dies that are about 0.5 mm on a side are placed about 10 mm apart on flexible plastic substrate 142. (FIG. 11 is not drawn to scale.) Because plastic substrate 142 is flexible, the LED dies 121, 136 can be picked and placed onto flexible plastic substrate 142 in a reel-to-reel process. Even when flexible plastic substrate 142 is wound on a reel, however, the portion of top surface 122 below the 0.5 millimeter length of LED die 121 remains substantially flat.

Instead of placing the dies on a layer 134 of asymmetric conductor material 132, as done for light source 120, the dies of light source 141 are placed on only a small amount of asymmetric conductor material 132. Just enough asymmetric conductor material is dispensed to form an electrical and mechanical connection between LED die 121 and substrate 142 without seeping out significantly beyond the lateral boundary 143 of LED die 121 when the die is pressed into the substrate to deform the conducting particles 133. Diffusively reflective material 135 is then dispensed over top surface 122 of substrate 142 between the dies. Because asymmetric conductor material 132 is present between the dies and substrate 142, the diffusively reflective material 135 remains outside the lateral boundary 144 of LED die 121.

In one embodiment, asymmetric conductor material 132 and diffusively reflective material 135 are cured in a single heating step. The carrier material should be the same for both asymmetric conductor material 132 and reflective material 135 if a single curing step is used. In this case, the transparent carrier material in asymmetric conductor material 132 is silicone as opposed to epoxy. Uncured silicone should not be placed in contact with uncured epoxy because the epoxy will react with the palladium catalyst in the silicone and degrade the silicone. Several small drops of asymmetric conductor material 132 are first dispensed onto the traces on top surface 122 of flexible substrate 142. LED dies 121 and 136 are then placed over the appropriate traces. Before asymmetric conductor material 132 is cured, diffusively reflective material 135 is dispensed onto top surface 122 between LED die 121 and LED die 136. Sufficient reflective material 135 is dispensed to cover the side surfaces 128 of LED dies 121 and 136. Then LED dies 121 and 136 are pressed into asymmetric conductor material 132 such that the conducting particles 133 deform between the contacts on the dies and the traces on substrate 142. While the dies are being pressed down onto substrate 142, asymmetric conductor material 132 and diffusively reflective material 135 are cured together.

Then thin layer 138 of silicone is spread over diffusively reflective material 135 and the tops of the LED dies 121, 136. Thin layer 138 acts as an adhesive to bond optics layer 139 over the LED dies. A layer of phosphor particles 140 is sprayed over the bottom surface of optics layer 139 before optics layer 139 is attached to silicone layer 138. In this low-cost light source 141, optics layer 139 has no phosphor particles dispersed in the cured silicone that forms the lenslets. Before silicone layer 138 is cured, and optics layer 139 is placed over silicone layer 138. Optics layer 139 is rolled over the top of layer 138 in a reel-to-reel process. Silicone layer 138 is then cured by heating.

Figure 12:
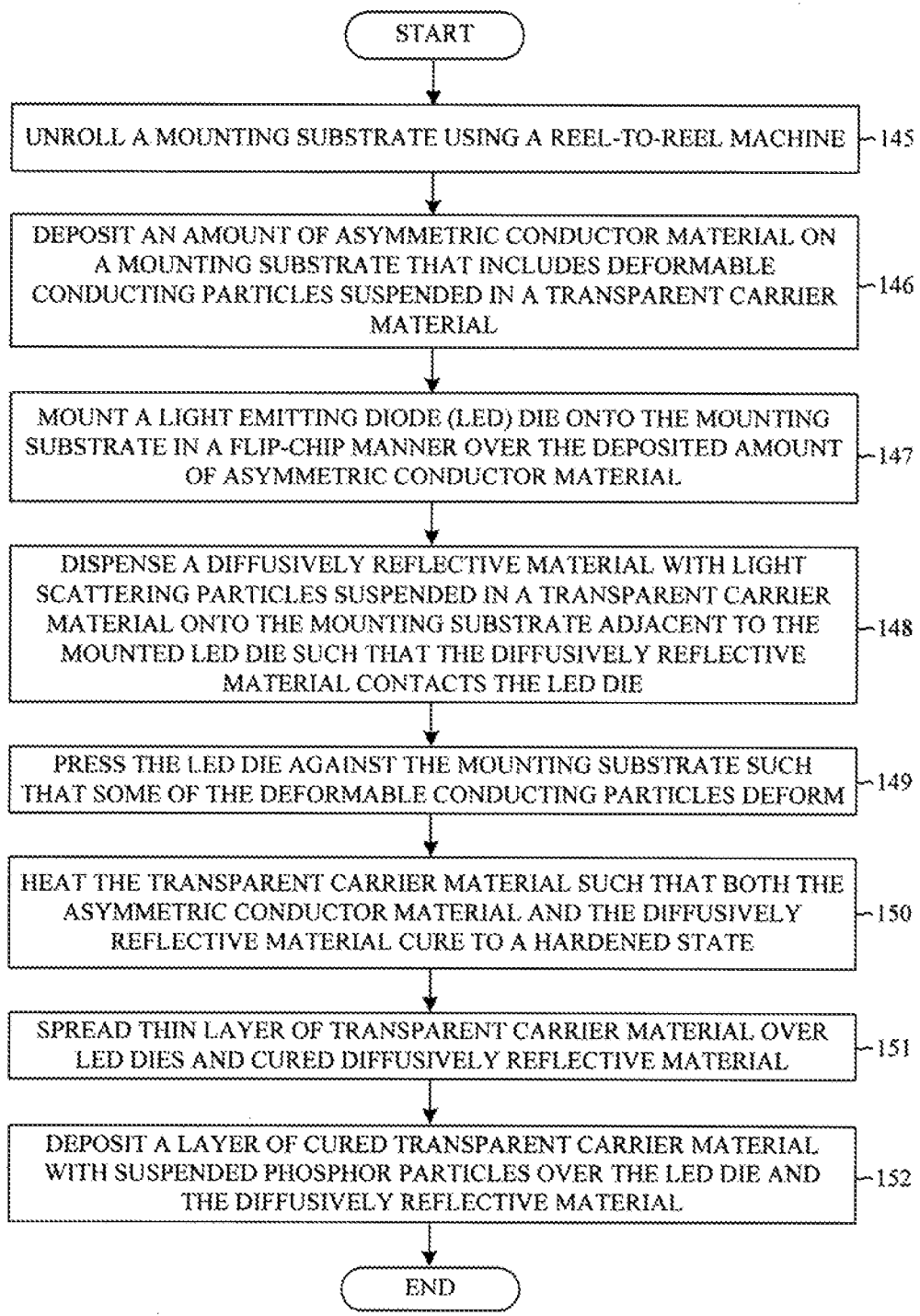
FIG. 12 is a flowchart of steps for making a strip light source by flip-chip mounting LED dies separated by diffusively reflective material.
Figure 13:
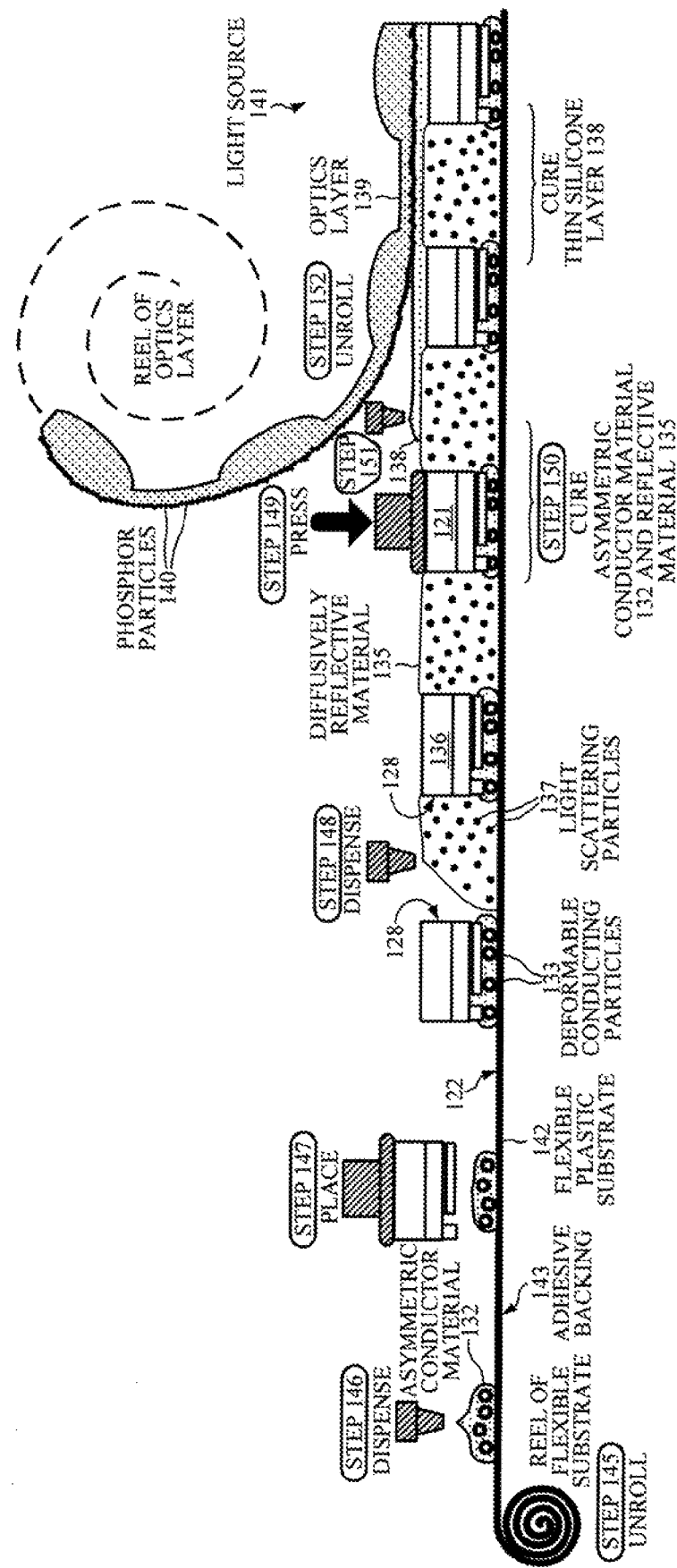
FIG. 13 illustrates a reel-to-reel process for making the strip light source of FIG. 11.

FIG. 12 is a flowchart illustrating steps 145-152 of a reel-to-reel process by which light source 141 of FIG. 11 is manufactured. The steps of the method of FIG. 12 are illustrated in FIGS. 13 and 14.

In a first step 145, flexible plastic substrate 142 is unrolled using a reel-to-reel machine before asymmetric conductor material 132 is deposited onto the substrate.

Figure 14A:
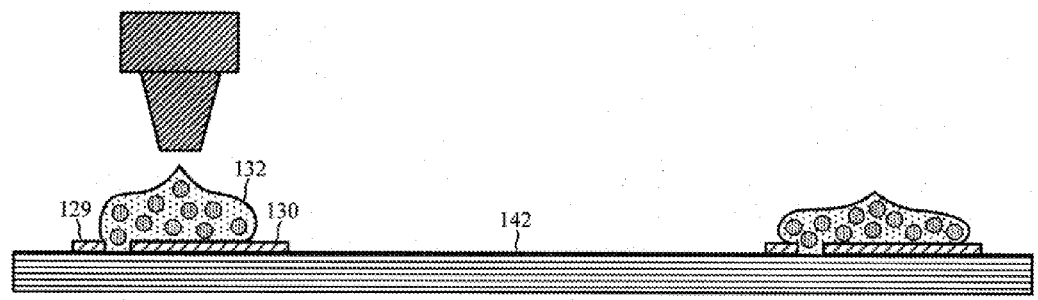
FIGS. 14A-F are cross-sectional views of the light source of FIG. 11 at various stages of the manufacturing method of FIG. 12.

In step 146, a small amount of asymmetric conductor material 132 is deposited on a mounting substrate. Step 146 is illustrated by FIG. 14A. The mounting substrate is flexible plastic substrate 142 that was unrolled from a reel of flexible substrate in step 145. The asymmetric conductor material 132 includes deformable conducting particles 133 suspended in a transparent carrier material. Although FIG. 14A shows a single drop of asymmetric conductor material 132 being dispensed onto substrate 142, several smaller dots are deposited in the actual manufacturing process. The asymmetric conductor material 132 is deposited over the traces 129-130 on top surface 122 of substrate 142 on which an LED die will be placed.

Figure 14B:
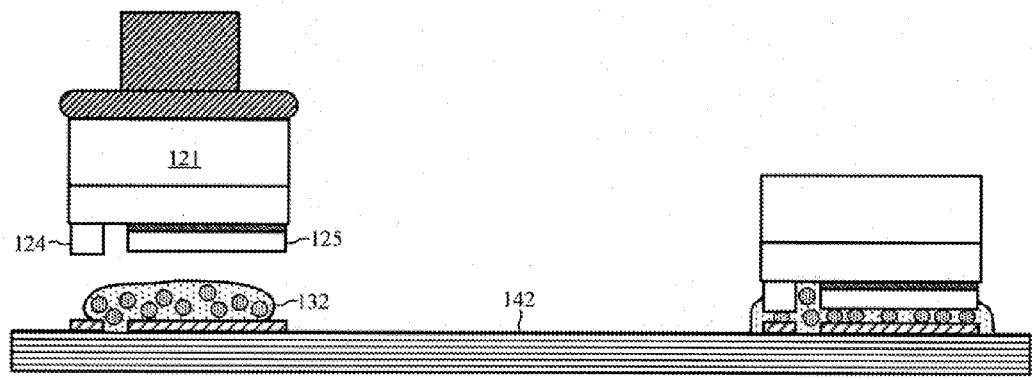

In step 147, LED die 121 is mounted onto substrate 142 in a flip-chip manner over the deposited amount of asymmetric conductor material 132. Step 147 is illustrated by FIG. 14B.

Figure 14C:
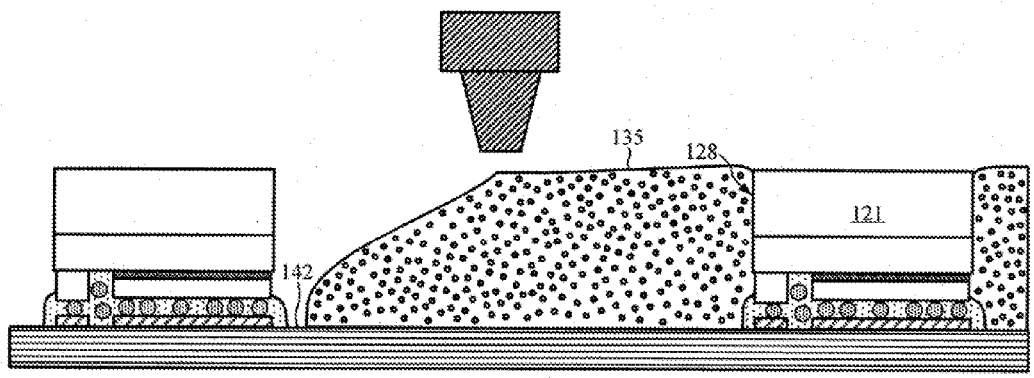

In step 148, diffusively reflective material 135 is dispensed onto the mounting substrate adjacent to the mounted LED dies such that reflective material 135 contacts the side surfaces 128 of the LED dies. Diffusively reflective material 135 includes light scattering particles 137 suspended in the transparent carrier material. The carrier materials of the asymmetric conductor material 132 and the reflective material 135 are the same. In this case, both carrier materials are silicone. In another embodiment, epoxy is the carrier material in both asymmetric conductor material 132 and reflective material 135. Because the carrier materials are the same, asymmetric conductor material 132 need not be cured before reflective material 135 is dispensed adjacent to the dies and contacting the uncured asymmetric conductor material 132. Step 148 is illustrated by FIG. 14C.

Figure 14D:
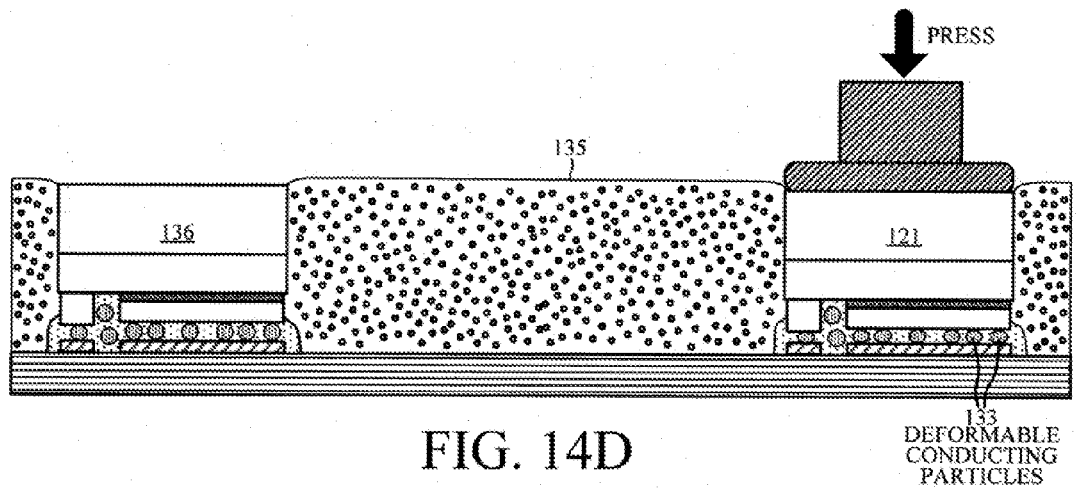

In step 149, LED die 121 is pressed against mounting substrate 142 such that some of the deformable conducting particles 133 deform and form an electrical connection between the contact pads on LED die 121 and the traces on substrate 142. Step 149 is illustrated by FIG. 14D.

In step 150, the transparent carrier material of both the asymmetric conductor material and the diffusively reflective material is heated such that both asymmetric conductor material 132 and reflective material 135 cure to a hardened state. In one embodiment of the manufacturing method of FIG. 12, the curing step 150 and the pressing step 149 are performed concurrently. Step 150 is performed in two substeps. In the first substep, asymmetric conductor material 132 and reflective material 135 are pre-heated to about 80 degrees Celsius for about two minutes. Then in step 149, LED die 121 is pressed down with two bumps, each having a force of about 0.4 Neutons. So the LED dies are pressed with a total force of 0.8 Neutons to deform the conducting particles 133. While the LED dies are being pressed down onto substrate 142, the second curing substep is performed. While the LED dies are being pressed, asymmetric conductor material 132 and reflective material 135 are heated to about 230 degrees Celsius for about thirty seconds to complete the curing.

Figure 14E:
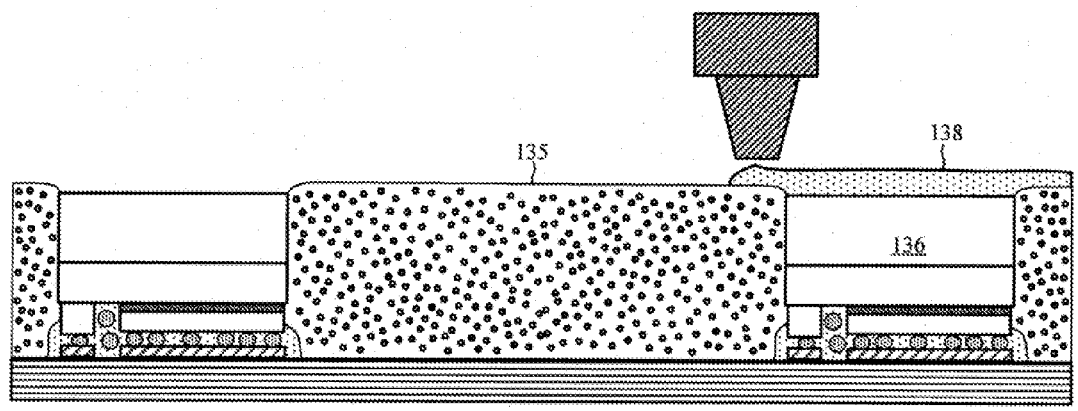

In step 151, thin layer 138 of transparent carrier material is spread over the top of the LED dies 121, 136 and the cured diffusively reflective material 135. Layer 138 is not cured in step 151. Step 151 is illustrated by FIG. 14E.

Figure 14F:
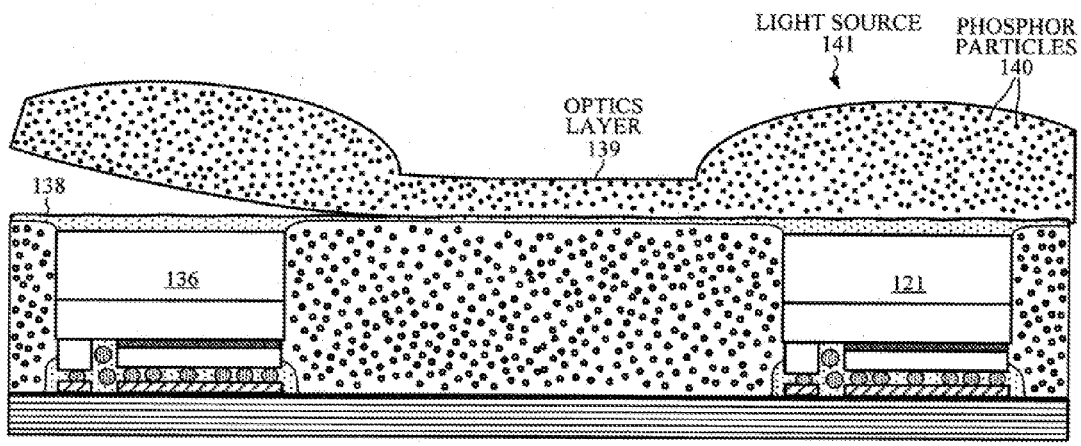

In step 152, a layer of cured transparent carrier material is deposited over the thin layer 138 of uncured transparent carrier material. Layer 138 acts as an adhesive and attaches the layer of cured transparent carrier material to the top of the LED dies 121, 136 and the diffusively reflective material 135. The entire light source 141 is then heated, and the thin layer 138 of carrier material cures. In one embodiment, the layer of cured transparent carrier material is optics layer 139 in which lenslets have previously been formed using a molding process. Phosphor particles 140 suspended in the cured transparent carrier material and convert the blue light emitted from LED die 121 into yellowish light. Optics layer 139 is unrolled from a reel using a reel-to-reel machine. Step 152 is illustrated by FIG. 14F.

In another embodiment, a layer of phosphor particles 140 is dusted onto the bottom surface of the layer of cured transparent carrier material 139 as shown in FIG. 13. The phosphor particles are then embedded into the uncured transparent carrier material 138 before the layer 138 is heated. Applying a layer of phosphor particles 140 to the underside of optics layer 139 can be less expensive than molding optics layer 139 using a carrier material in which phosphor particles are disbursed.

The string of LED dies with lenslets of light source 141 can then be rolled up onto a reel. The reel of light source 141 can easily be transported to the installation site, such as a commercial building. For example, at the installation site, a strip of light source 141 can be cut from the reel at a length corresponding to a T8 fluorescent bulb. The protective paper can then be peeled from adhesive backing 143 on the underside of flexible plastic substrate 142 of light source 141, and the strip of light source 141 can be taped to the frame of a troffer. Traces that extend from upper surface 122 of flexible plastic substrate 142 are then connected to the power lines of the troffer.

The method of manufacturing light source 141 shown in FIG. 12 reduces the number of required curing steps and the number of components in order to achieve a low cost process for making distributed lighting. Modifications of the method of FIG. 12 can improve the durability and the light extraction of the produced light sources at the expense of added steps and components. FIGS. 15A-D are flowcharts illustrating other methods of making light sources that use diffusively reflective material instead of reflective cups to reflect light that is emitted sideways from the LED dies.

Figures 15A, 15B:
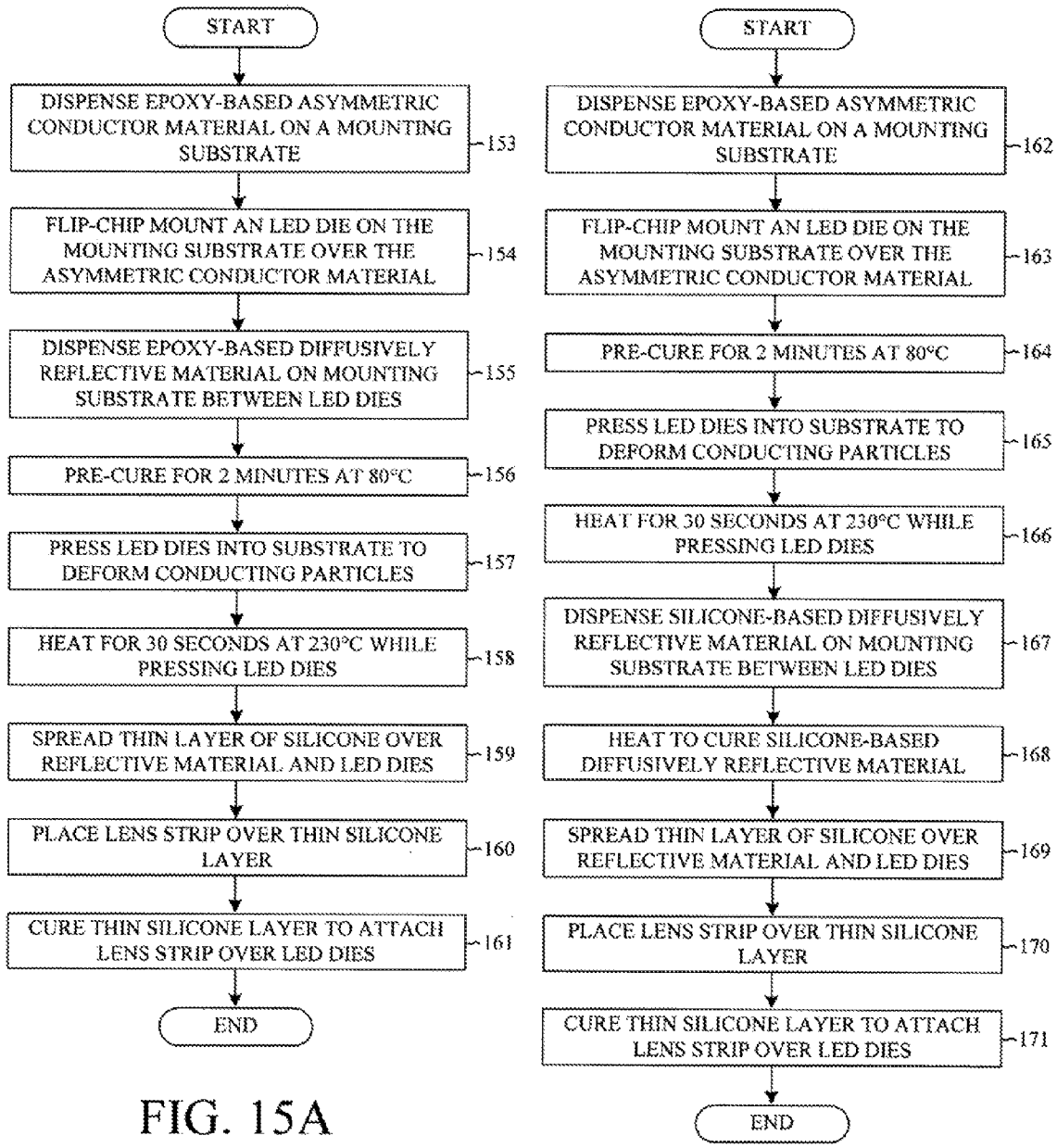
FIGS. 15A-D are flowcharts illustrating methods in addition to the method of FIG. 12 for making light sources that use diffusively reflective material instead of reflective cups to reflect light that is emitted sideways from the LED dies.

FIG. 15A shows the steps 153-161 of a first alternate method of manufacturing a strip light source in which epoxy is the transparent carrier material in both asymmetric conductor material 132 and reflective material 135. LED dies are flip-chip mounted over an epoxy-based asymmetric conductor material that has been dispensed on a mounting substrate. The epoxy-based diffusively reflective material containing $TiO_2$ spheres is dispensed on the mounting substrate between the LED dies. The carrier material is pre-cure for two minutes at 80 degrees Celsius, which starts the chemical reaction of the curing process. Then "tonnage" (a metal block) is applied to press the LED dies down onto the substrate and thereby deform those conducting particles that happen to be positioned between the contacts on the LED dies and the corresponding traces on the substrate. While the LED dies are being pressed down, the carrier material is heated to 230 degrees Celsius for thirty seconds. Then a thin layer of silicone is applied as glue over the top of the LED dies and the cured reflective material. A lens strip molded from silicone is placed over the thin layer of silicone, and the silicone layer is cured. The epoxy-based carrier material of the light source produced with the method of FIG. 15A will likely degrade faster than silicone-based carrier material in the presence of the heat generated by the LED dies.

FIG. 15B shows the steps 162-171 of a second alternate method of manufacturing a strip light source in which epoxy is the transparent carrier material for asymmetric conductor material 132, but silicone is the transparent carrier material for reflective material 135. Because uncured silicone should not be placed in contact with uncured epoxy, the method of FIG. 15B includes an additional curing step for the epoxy before the silicone-based reflective material is dispensed between the LED dies.

Figures 15C, 15D:
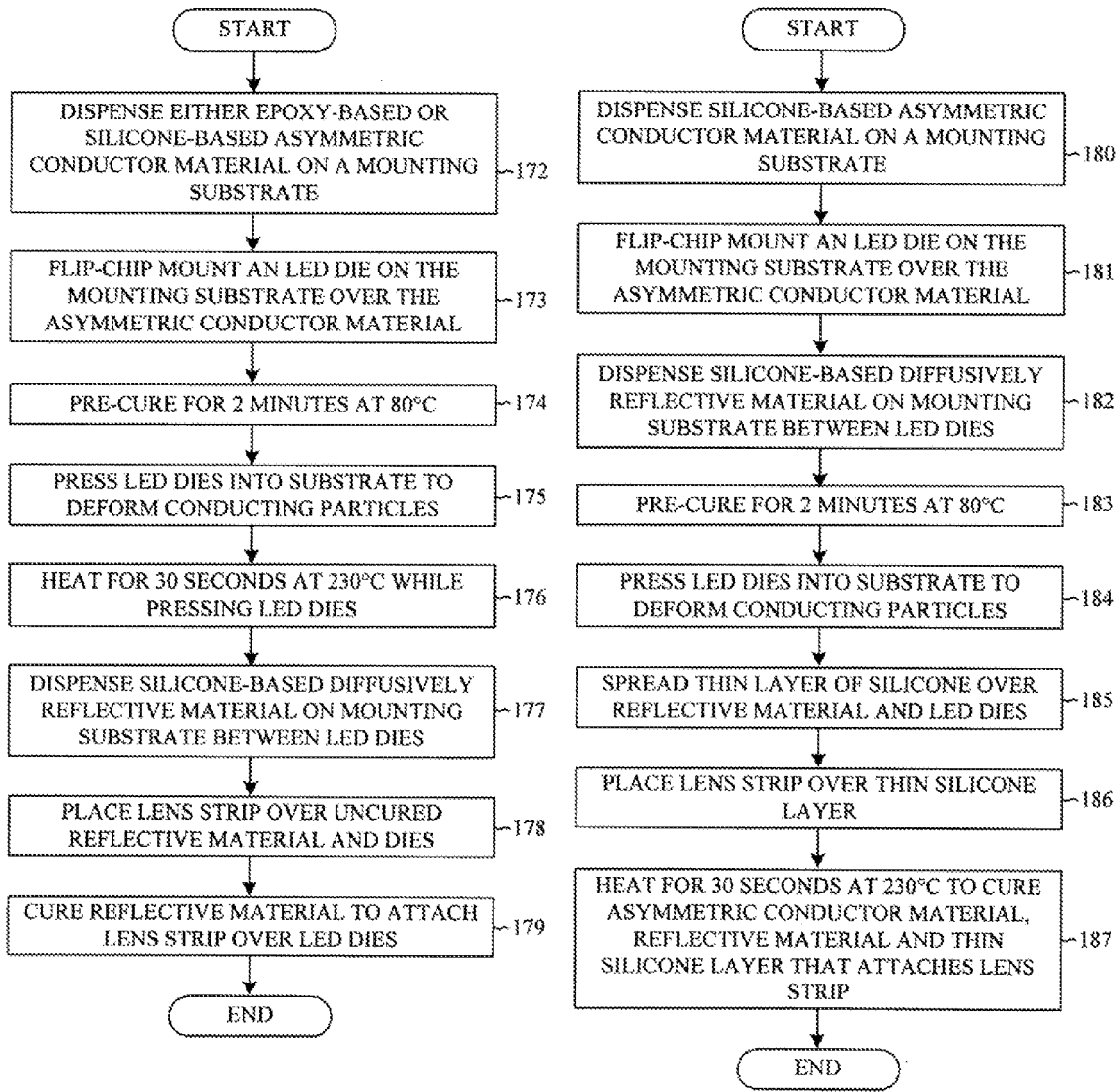

FIG. 15C shows the steps 172-179 of a third alternate method of manufacturing a strip light source in which the uncured reflective material is used as a glue to attach the lens strip.

FIG. 15D shows the steps 180-187 of a fourth alternate method of manufacturing a strip light source in which a single high-temperature cure step is used to cure the asymmetric conductor material, the diffusively reflective material and the thin silicone layer under the lens strip. In the method of FIG. 15D, silicone is used as the carrier material for all of the asymmetric conductor material, the reflective material, the thin layer that attaches the lens strip and the molded lens strip itself. Alternatively, epoxy can be used as the carrier material for each of these materials and layers. Thus, the lens strip that includes phosphor particles would be constructed from the same epoxy medium as the asymmetric conductor material.

Figure 16:
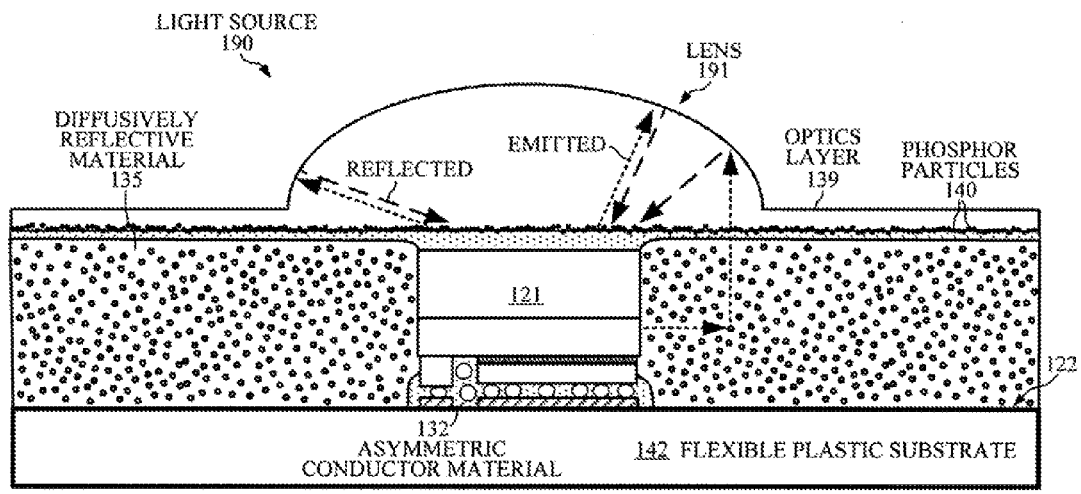
FIG. 16 is a cross-sectional view of the light source of FIG. 11 with a lens having a conventional shape.

FIG. 16 shows a light source 190 in which diffusively reflective material 135 reflects light emitted from the side surfaces 128 of LED die 121 in order to achieve greater light extraction without using a reflective cup. Much of the light emitted from LED die 121, however, still does not escape light source 190 because it is reflected back from the surface of the conventional lens 191 and is absorbed by LED die 121. Most of the light emitted by LED die 121 exits through the upper surface as opposed to the side surfaces. The conventional form of lens 191 maximizes the area of the lens surface that is at a right angle to the location from which the most light is being emitted because light is less likely to be reflected if it strikes the lens surface closer to a right (normal) angle. So the lens is designed so that the first order effect of reflection at the lens surface is minimized.

Where much of the light does not exit the lens on the first pass, however, the second order effects of whether the reflected light is absorbed should be given a larger influence over the shape of the lens. About 45% of the exiting light that strikes the silicone/air interface of lens 191 at a normal angle is reflected because the index of refraction of the silicone is about 1.41 (the index changes with temperature) and the index of refraction of air is about 1.00. The upper surface of LED die 121 is assumed to act as a Lambertian emitter in which the intensity of the emitted light is at a maximum normal to the upper surface and decreases in proportion to the cosine of the angle away from normal. Thus, because the upper surface of LED die 121 is not a point light source, a majority of the light does not strike the silicone/air interface of lens 191 exactly at a normal angle, and a majority of the light emitted by LED die 121 is reflected back. The conventional form of lens 191 reflects light approximately back to its source. Because the upper surface of LED die 121 has a reflectivity of about 50% as opposed to the 95% reflectivity of reflective material 135, the conventional form of lens 191 shown in FIG. 16 does not maximize the light extraction characteristics of light source 190, which has a thick layer of reflective material 135 adjacent to LED die 121.

Figure 17A:
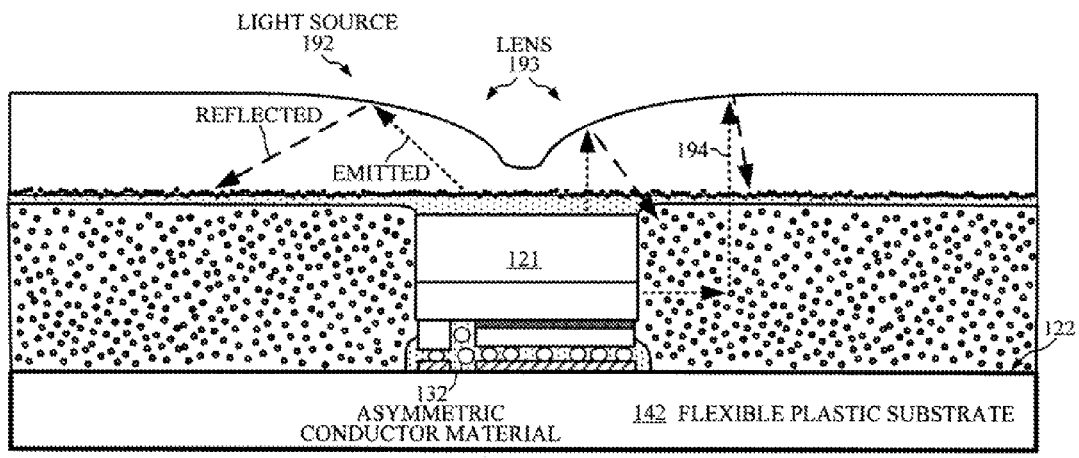
FIG. 17A is a cross-sectional view of the light source of FIG. 11 with a lens having a novel shape that improves the light extraction characteristics of the light source.

FIG. 17A shows a strip light source 192 with reflective material 135 adjacent to LED die 121 and a novel lens 193 having a dimple above the die. More light is able to exit light source 192 than light source 190 because the light that does not exit lens 193 on the first pass is more likely to be reflected back to the 95% reflective material 135 instead of to the 50% reflective upper surface of LED die 121. Emitted light that is reflected back off the surface of lens 193 is directed away from the light's source on the LED die and towards the area adjacent to the die. In addition, light 194 that exits the side surfaces 128 of LED die 121, is reflected up by material 135, and then is reflected back down at the silicone/air interface of lens 193 is more likely to strike reflective material 135 than LED die 121. Dimple shaped lens 193 improves the light extraction characteristics of light sources with large second order effects of light being reflected back off the lens surface where the LED die has a much lower reflectivity than the material surrounding the die.

Figure 17B:
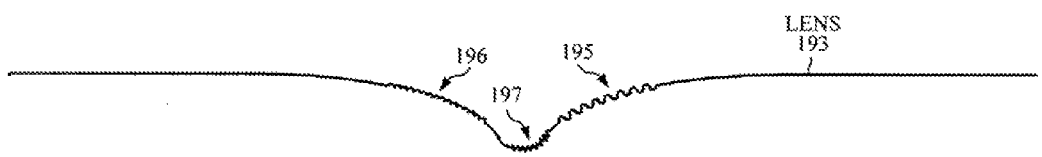
FIG. 17B shows examples of micro-structures on the surface of the novel lens of FIG. 17A.

FIG. 17B shows structures on the surface of lens 193 that improve light extraction. Although the largest plurality of light originates from the center of the upper surface of LED die 121, the light that strikes lens 193 originates from multiple locations, including the many phosphor particles 140, the many light scattering particles 137 and many locations over the upper surface of LED die 121. Thus, light strikes each location of lens 193 from many different angles. The light that strikes a structured surface of lens 193 instead of a smooth surface is more likely to exit lens 193 by finding a normal angle that exhibits a lower total internal reflection (TIR). FIG. 17B shows three types of structured surfaces of lens 193 that improve light extraction. The surface of lens 193 can have a small sinusoidal wave structure 195, a "rectified" wave structure 196 or a saw-tooth structure 197. In the actual implementation, one micro-structure covers the entire surface of lens 193. Each of these micro-structures can be two-dimensional or three-dimensional. For example, ridges of the two-dimensional saw-tooth structure 197 can extend laterally across the light source strip. Or a three-dimensional saw-tooth micro-structure 197 would result in pyramids across the surface of lens 193. The three-dimensional "rectified" wave structure 196 would result in small hemispheres across the surface of lens 193.

Figure 18:
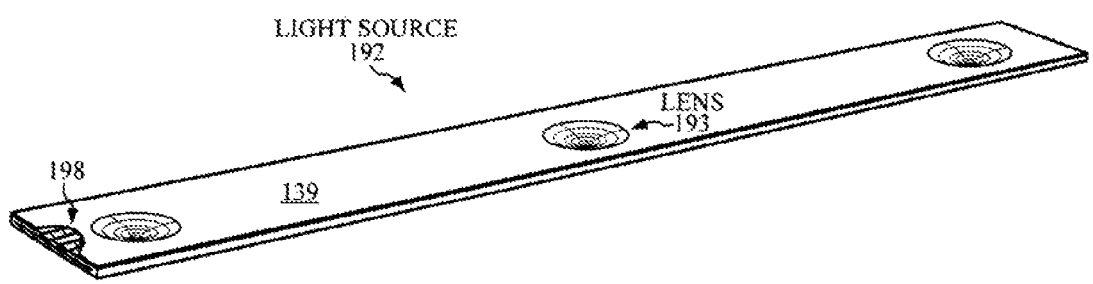
FIG. 18 is a perspective view of the strip light source of FIG. 17A with the novel dimple-shaped lenses.

FIG. 18 is a perspective view of strip light source 192 with dimple-shaped lenses 193. When light source 192 is attached to the inside surface of a troffer, optics layer 139 and reflective material 135 is peeled back to expose (at 198) the power and ground traces on the flexible plastic substrate 142. The power and ground traces are then attached to the power and ground wires of the troffer.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   depositing an amount of asymmetric conductor material on a mounting substrate, wherein the asymmetric conductor material comprises deformable conducting particles suspended in a transparent carrier material;
   mounting a light emitting diode (LED) die onto the mounting substrate in a flip-chip manner over the deposited amount of asymmetric conductor material;
   dispensing a diffusively reflective material onto the mounting substrate adjacent to the mounted LED die such that the diffusively reflective material contacts the LED die, wherein the diffusively reflective material comprises light scattering particles suspended in the transparent carrier material;
   pressing the LED die against the mounting substrate such that some of the deformable conducting particles deform after dispensing the diffusively reflective material; and
   heating the transparent carrier material such that both the asymmetric conductor material and the diffusively reflective material cure to a hardened state.

2. The method of claim 1, wherein the asymmetric conductor material is not fully cured before the heating of the transparent carrier material.

3. The method of claim 1, wherein the mounting substrate is a flexible plastic substrate.

4. The method of claim 1, further comprising:
   unrolling the mounting substrate using a reel-to-reel machine before the depositing the amount of asymmetric conductor material.

5. The method of claim 1, wherein the transparent carrier material is silicone.

6. The method of claim 1, further comprising:
   depositing a layer of cured transparent carrier material over the LED die and the diffusively reflective material, wherein the layer comprises phosphor particles suspended in the cured transparent carrier material.

7. The method of claim 1, further comprising:
   depositing phosphor particles over the LED die and the diffusively reflective material.

8. The method of claim 1, wherein the LED die has surface mount contacts that include a p-contact and an n-contact, wherein connection traces are disposed on a top surface of the mounting substrate, wherein the connection traces include an n-trace and a p-trace, and wherein the pressing of the LED die against the mounting substrate causes a first plurality of the deformable conducting particles to deform between the n-trace and the n-contact and a second plurality of the deformable conducting particles to deform between the p-trace and the p-contact.

9. The method of claim 8, wherein the n-trace is electrically coupled to the n-contact through the deformable conducting particles.

10. The method of claim 1, wherein the diffusively reflective material contacts a side surface of the LED die but does not contact a top surface of the LED die or a bottom surface of the LED die.

11. The method of claim 1, wherein the light scattering particles are spheres of titanium dioxide.

12. The method of claim 1, further comprising:
    placing an optics layer over the diffusively reflective material and the LED die, wherein the optics layer includes a dimple-shaped lens centered over the LED die.

13. The method of claim 1, wherein the deformable conducting particles have an average first diameter when the deformable conducting particles are not deformed, wherein the light scattering particles have an average second diameter, and wherein the average first diameter is greater than the average second diameter.

14. A method comprising:
    dispensing an amount of asymmetric conductor material on a mounting substrate, wherein the asymmetric conductor material comprises deformable conducting particles suspended in an epoxy-based carrier material;
    mounting a light emitting diode (LED) die onto the mounting substrate in a flip-chip manner over the dispensed amount of asymmetric conductor material;
    pressing the LED die against the mounting substrate such that some of the deformable conducting particles deform;
    heating the epoxy-based carrier material while pressing the LED die against the mounting substrate;
    dispensing a diffusively reflective material onto the mounting substrate adjacent to the mounted LED die such that the diffusively reflective material contacts a side surface of the LED die but does not contact a top surface of the LED die, wherein the diffusively reflective material comprises light scattering particles suspended in a silicon-based carrier material; and
    heating the silicon-based carrier material such that the diffusively reflective material cures to a hardened state.

15. The method of claim 14, further comprising:
    dispensing a layer of silicone over the LED die and the diffusively reflective material;
    placing a lens strip over the layer of silicone; and
    heating the layer of silicone to attach the lens strip over the LED die.

16. The method of claim 15, wherein the layer of silicone includes phosphor particles suspended in the silicone.

17. The method of claim 15, wherein the lens strip includes a dimple-shaped lens centered over the LED die.

18. The method of claim 14, wherein the epoxy-based carrier material is not fully cured before the heating of the silicon-based carrier material.

19. The method of claim 14, further comprising:
    unrolling the mounting substrate using a reel-to-reel machine before the dispensing of the amount of asymmetric conductor material.

20. The method of claim 14, further comprising:
    depositing a layer of cured transparent carrier material over the LED die and the diffusively reflective material, wherein the layer comprises phosphor particles suspended in the cured transparent carrier material.

* * * * *